United States Patent
Masuda

(10) Patent No.: US 9,156,206 B2
(45) Date of Patent: Oct. 13, 2015

(54) METHOD FOR MANUFACTURING JOINED BODY, AND JOINED BODY

(75) Inventor: Hiroyuki Masuda, Hyogo (JP)

(73) Assignee: JOLED INC., Tokyo (JP)

( * ) Notice: Subject to any disclaimer, the term of this patent is extended or adjusted under 35 U.S.C. 154(b) by 39 days.

(21) Appl. No.: 14/122,374

(22) PCT Filed: May 31, 2011

(86) PCT No.: PCT/JP2011/003038
§ 371 (c)(1),
(2), (4) Date: Nov. 26, 2013

(87) PCT Pub. No.: WO2012/164612
PCT Pub. Date: Dec. 6, 2012

(65) Prior Publication Data
US 2014/0127480 A1    May 8, 2014

(51) Int. Cl.
| | |
|---|---|
| *B29C 65/48* | (2006.01) |
| *B32B 37/15* | (2006.01) |
| *B32B 38/04* | (2006.01) |
| *B32B 38/10* | (2006.01) |
| *B29C 69/00* | (2006.01) |
| *G02B 5/20* | (2006.01) |
| *H01L 51/00* | (2006.01) |
| *B32B 3/02* | (2006.01) |

(52) U.S. Cl.
CPC .............. *B29C 69/004* (2013.01); *B32B 3/02* (2013.01); *G02B 5/20* (2013.01); *G02B 5/201* (2013.01); *H01L 51/003* (2013.01); *H01L 51/0024* (2013.01); *H01L 2251/566* (2013.01); *Y10T 156/1082* (2015.01); *Y10T 428/24851* (2015.01)

(58) Field of Classification Search
USPC ......... 156/230, 231, 235, 248–250, 252, 257, 156/267, 272.2, 272.28
See application file for complete search history.

(56) References Cited

U.S. PATENT DOCUMENTS 4,249,438 A * 2/1981 Kelley ............................. 83/53
4,548,113 A * 10/1985 Topperwien et al. ........... 83/345

(Continued)

FOREIGN PATENT DOCUMENTS

| | | | |
|---|---|---|---|
| GB | 978554 A | * | 12/1964 |
| GB | 1069090 A | * | 5/1967 |

(Continued)

OTHER PUBLICATIONS

English Abstract of JP 59-87155.*

(Continued)

*Primary Examiner* — Sing P Chan
(74) *Attorney, Agent, or Firm* — Greenblum & Bernstein, P.L.C.

(57) ABSTRACT

The present invention provides a joined body manufacturing method with which the resin material is accurately attached to the first base material. The method includes: an attaching step of attaching a sheet material having resin material on one main surface of a sheet base material to a first base material such that a predetermined area is covered; a forming step of forming a slit for ease of separation on the sheet material attached to the first base material in accordance with the predetermined area; and a separating step of separating part of the resin material inside the slit from the sheet base material such that the part of the resin material inside the slit remains on the predetermined area of the first base material and part of the resin material outside the slit does not remain on the first base material.

28 Claims, 26 Drawing Sheets

(56) References Cited

U.S. PATENT DOCUMENTS

| | | | | |
|---|---|---|---|---|
| 4,578,004 | A | * | 3/1986 | Reil ................................ 408/87 |
| 4,662,969 | A | * | 5/1987 | Wang et al. .................... 156/253 |
| 4,696,394 | A | * | 9/1987 | Estkowski et al. ............. 206/303 |
| 4,790,475 | A | * | 12/1988 | Griffin ............................ 229/69 |
| 6,739,040 | B1 | * | 5/2004 | Nakamura et al. .............. 29/830 |
| 7,838,576 | B2 | | 11/2010 | Inoue et al. |
| 8,357,443 | B2 | * | 1/2013 | Narahashi et al. ........... 428/41.8 |
| 8,500,302 | B2 | | 8/2013 | Ohta |
| 2004/0239827 | A1 | * | 12/2004 | Yamazaki et al. .............. 349/45 |
| 2007/0090759 | A1 | | 4/2007 | Choi et al. |
| 2007/0211189 | A1 | * | 9/2007 | Yamazaki et al. .............. 349/45 |
| 2009/0004772 | A1 | | 1/2009 | Jinbo et al. |
| 2009/0134786 | A1 | * | 5/2009 | Matsuzaki et al. ........... 313/504 |
| 2009/0221109 | A1 | | 9/2009 | Choi et al. |
| 2010/0044078 | A1 | * | 2/2010 | Narahashi et al. ............. 174/250 |
| 2010/0167437 | A1 | * | 7/2010 | Yamazaki et al. .............. 438/26 |
| 2010/0279578 | A1 | * | 11/2010 | Matsuzaki et al. .............. 445/25 |
| 2011/0248291 | A1 | | 10/2011 | Jinbo et al. |
| 2012/0064236 | A1 | | 3/2012 | Matsuzaki et al. |
| 2012/0295375 | A1 | * | 11/2012 | Yamazaki et al. .............. 438/27 |
| 2013/0306948 | A1 | * | 11/2013 | Yamazaki et al. .............. 257/40 |
| 2015/0053952 | A1 | * | 2/2015 | Okumura et al. ............... 257/40 |

FOREIGN PATENT DOCUMENTS

| | | | |
|---|---|---|---|
| JP | 59087155 A | * | 5/1984 |
| JP | 2002-358024 | | 12/2002 |
| JP | 2003-051380 | | 2/2003 |
| JP | 2004-191608 | | 7/2004 |
| JP | 2007-005107 | | 1/2007 |
| JP | 2007-115692 | | 5/2007 |
| JP | 3921482 | | 5/2007 |
| JP | 2007-200591 | | 8/2007 |
| JP | 2008-130312 | | 6/2008 |
| JP | 2008-211191 | | 9/2008 |
| JP | 2009-117181 | | 5/2009 |
| JP | 2010-182530 | | 8/2010 |
| JP | 2010-266873 | | 11/2010 |

OTHER PUBLICATIONS

International Search Report (ISR) in International Patent Application No. PCT/JP2011/003038, dated Sep. 6, 2011.

English Abstract of JP 59-87155, May 6, 2015.

* cited by examiner

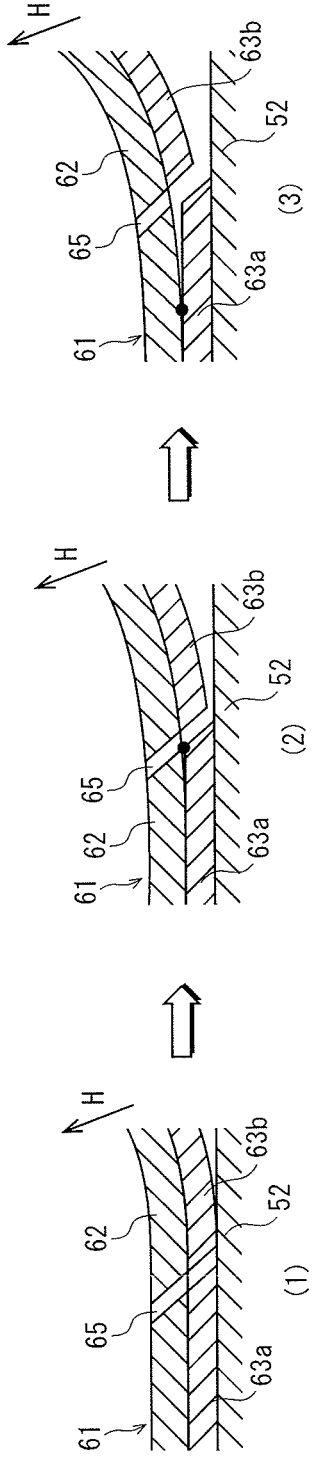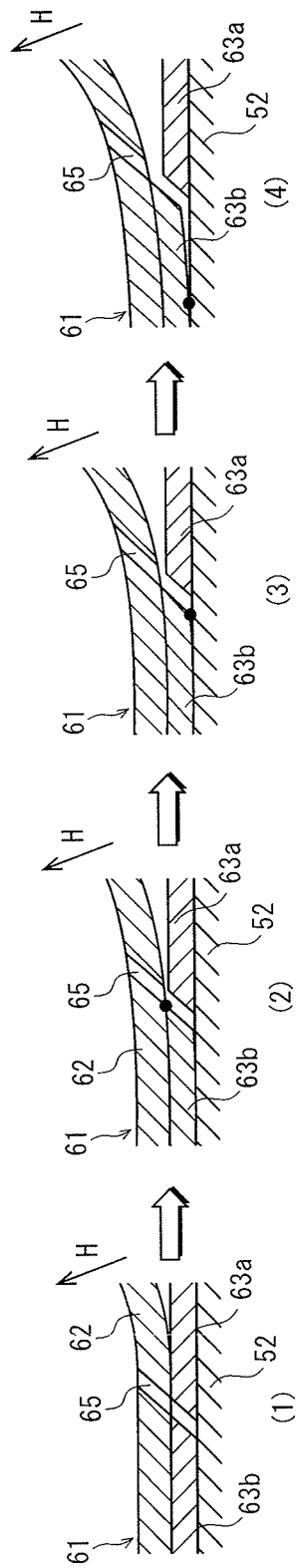

F1 > F3 > F2

F1, F2 > F3

F1 > F3 > F6

Without peeling film

F1>F3>F2

F1,F2>F3

With peeling film

F1>F3,F6

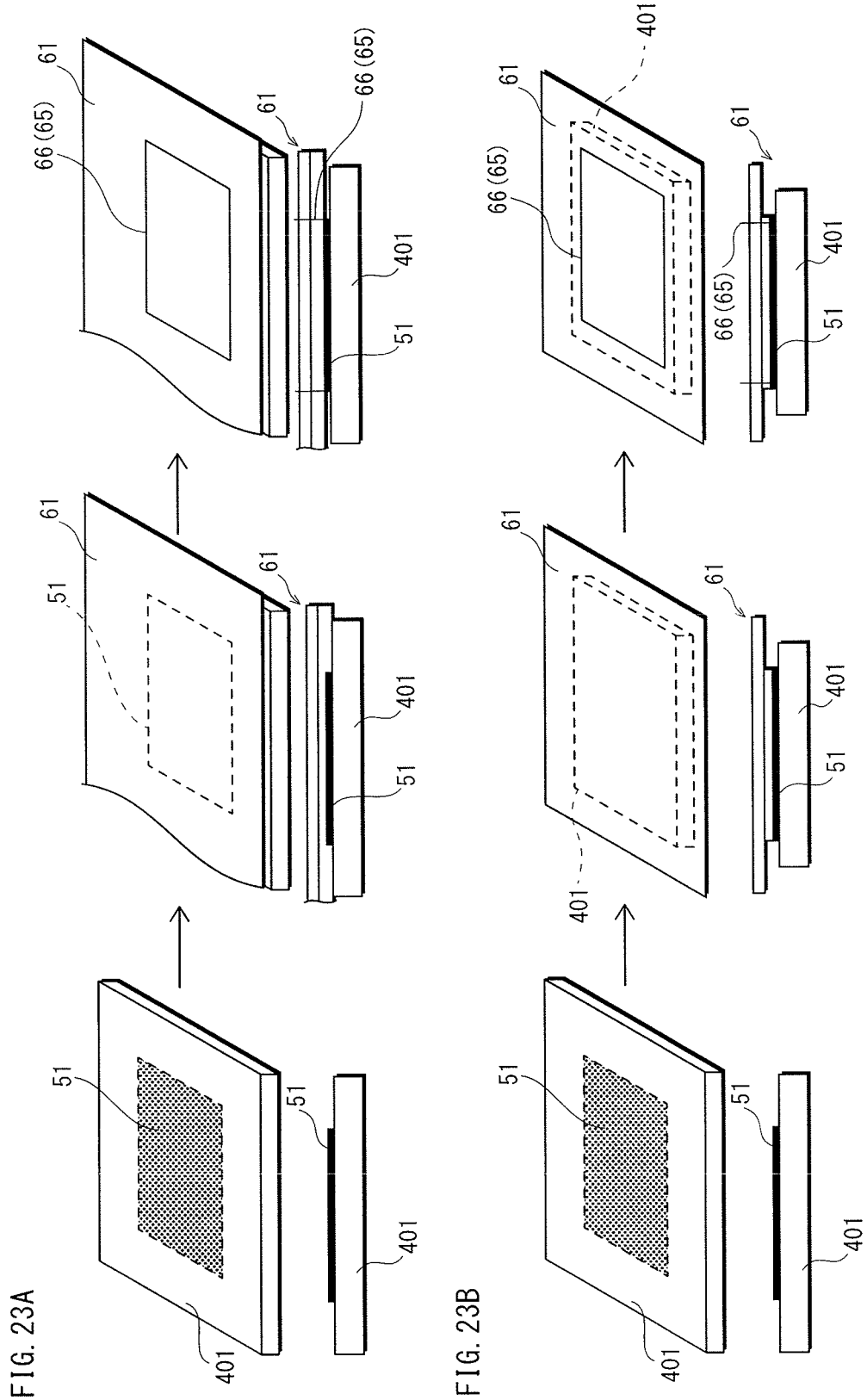

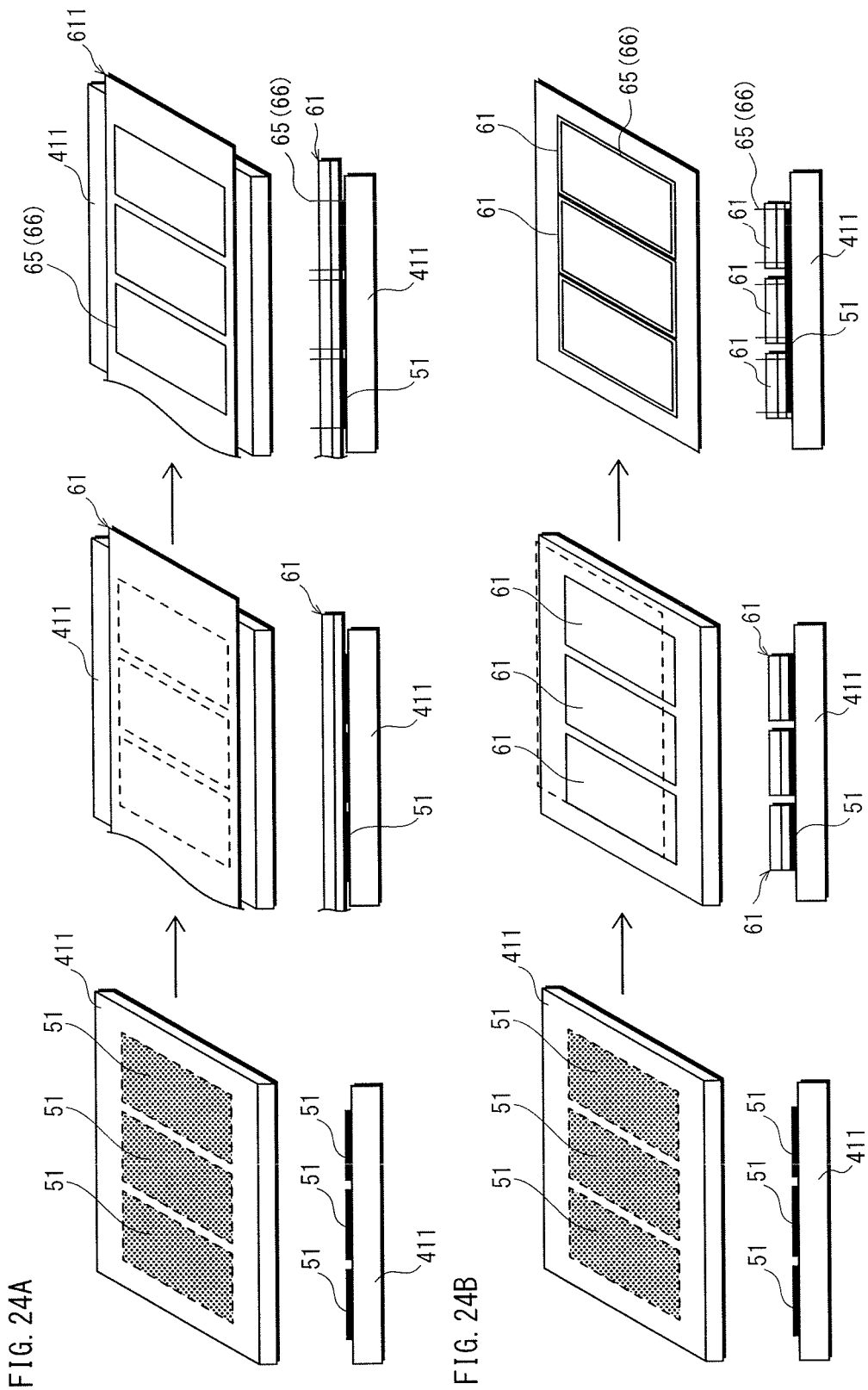

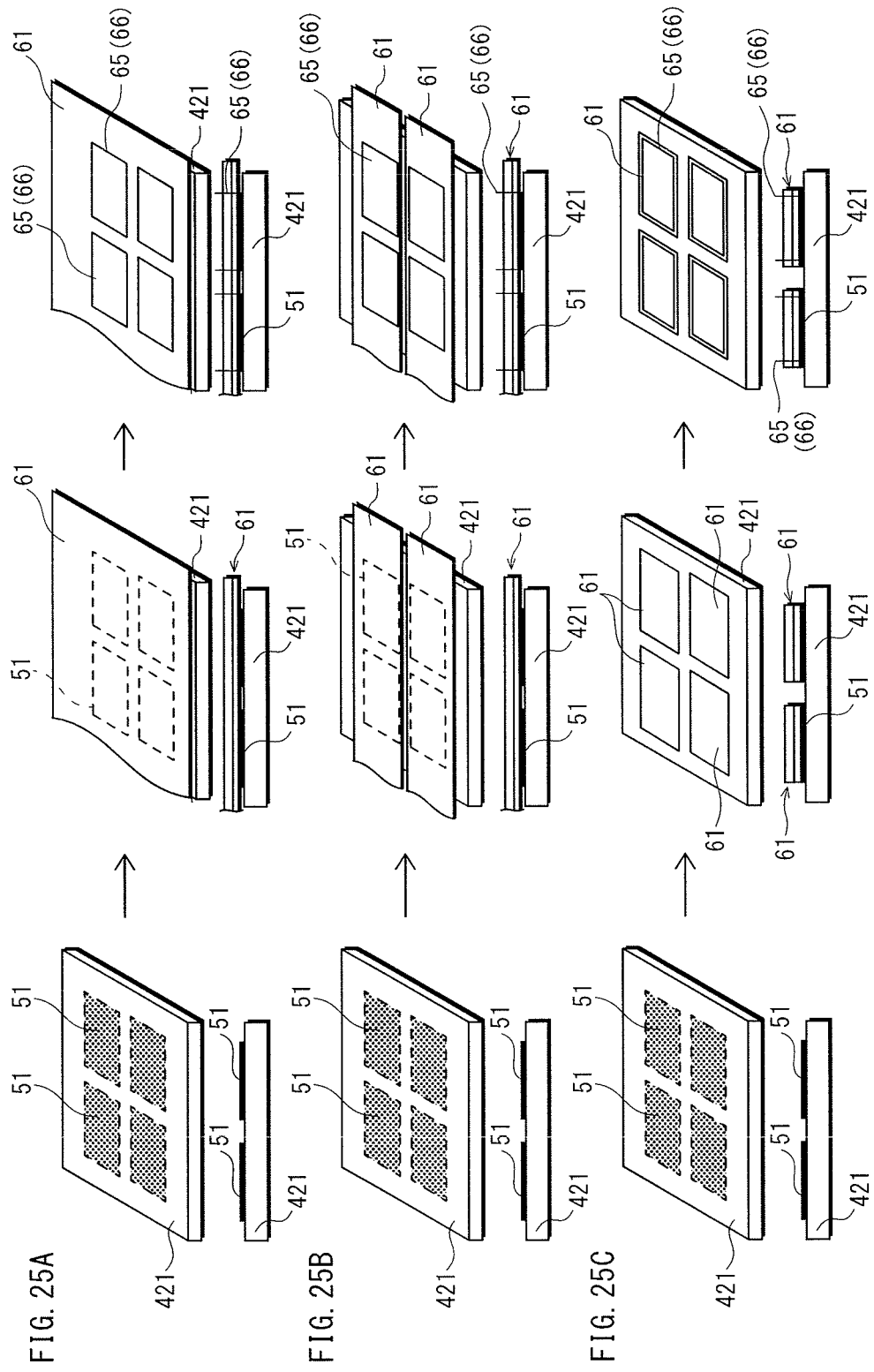

PRIOR ART
FIG. 26A
PRIOR ART
FIG. 26B
PRIOR ART
FIG. 26C
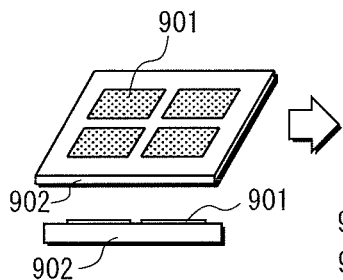
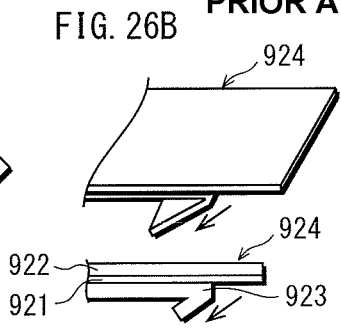
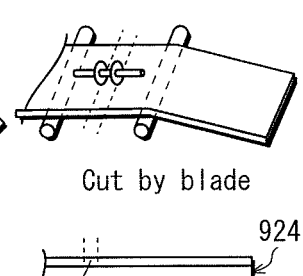
PRIOR ART
FIG. 26D
PRIOR ART
FIG. 26E
PRIOR ART
FIG. 26F
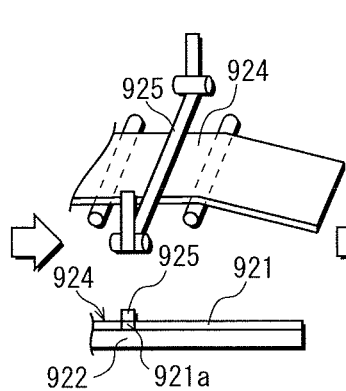
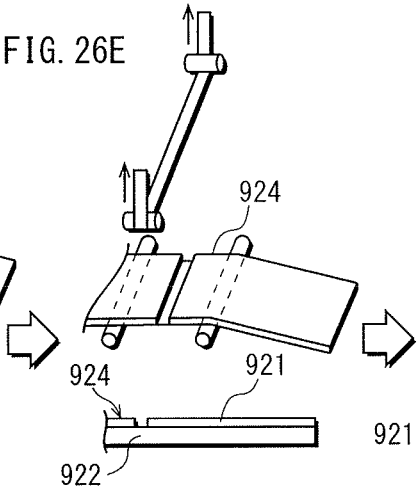
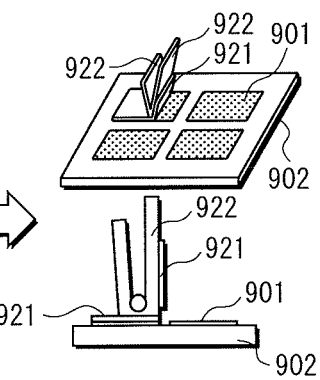
PRIOR ART
FIG. 26G
PRIOR ART
FIG. 26H
PRIOR ART
FIG. 26I
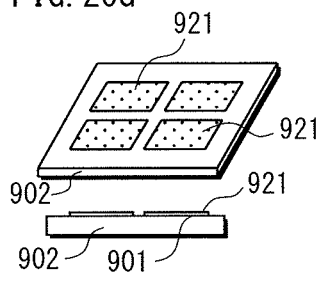
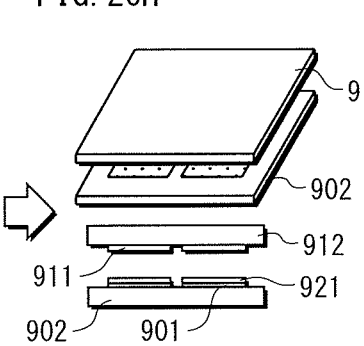
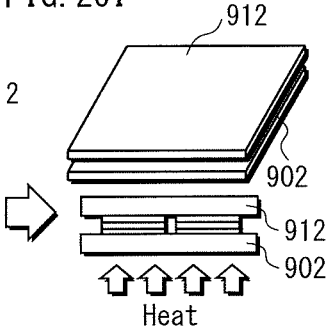
PRIOR ART
FIG. 26J
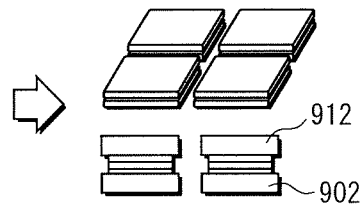

METHOD FOR MANUFACTURING JOINED BODY, AND JOINED BODY

TECHNICAL FIELD

The present invention relates to a method for manufacturing a joined body composed of a first base material and a second base material joined together by resin material attached to a predetermined area of the first base material, and the joined body.

BACKGROUND ART

There is a conventional joined body manufactured by joining the first material and the second material by using sheet-like resin material sandwiched between the first base material and the second base material. Such resin material is supplied as a sheet material, and the resin material is applied to the main surface of a sheet-like first separator (e.g., a film made of resin) and is covered with a second separator (e.g., a film made of resin), for example.

Such a joined body is manufactured through an attaching step of attaching resin material to the first base material, a uniting step of uniting the first base material and the second base material, and a curing step of curing the resin material.

The following describes a technology of attaching a sheet-like resin material to the first base material, with reference to a figure (for example, Patent Literatures 1 and 2).

According to conventional technology as shown in FIGS. 26A-26J, a joined body is manufactured by the following steps.

(a) Preparing the first base material 902 on which a plurality of first substrates 901 are formed, and performing UV ozone cleaning (FIG. 26A).

(b) Preparing a (rolled) sheet material 924 composed of resin material 921 and two separators 922 and 923 sandwiching the resin material 921, and peeling off one of the separators (here, the lower separator 923) while drawing out the sheet material 924 (FIG. 26B).

(c) Forming a slit in the surface of the resin material 921 from which the separator 923 has been removed, in accordance with an outline of a resin material part 921a of the resin material 921 (not forming a slit in the other separator 922) (FIG. 26C).

(d) Attaching peeling tape 925 to a part inside the resin material part 921a (FIG. 26D).

(e) Removing unnecessary resin material (921a) by peeling the peeling tape 924 off (FIG. 26E).

(f, g) Attaching the resin material 921 remaining on the other separator 922 and cut into a predetermined size to each of the first substrates 901 of the first base material 902, and peeling off the other separator 922 (FIGS. 26F and 26G).

(h) Uniting the second base material 912 on which a plurality of second substrates are formed to the first base material 902 so that the first substrates 901 respectively correspond in position to the second substrates (FIG. 26H).

(i) Curing the resin material 921 by heating (or applying UV to) the united first base material 902 and second base material 912 (FIG. 26I).

(j) Dividing the joined first base material 902 and second base material 912 into individual joined bodies each composed of the first substrate 901 and the second substrate, after curing the resin material 921 (FIG. 26J).

CITATION LIST

Patent Literature

[Patent Literature 1]
Japanese Patent Application Publication No. 2007-200591
[Patent Literature 2]
Japanese Patent Application Publication No. 2010-182530

SUMMARY OF INVENTION

Technical Problem

The above conventional technology has the problem that it is difficult to accurately attach the resin material to the first substrate.

That is, the resin material is deformed when the sheet material is cut in accordance with a position of the first substrate. Also, the resin material is deformed (mainly expanded) when the cut sheet material is attached to the first substrate. Further, the resin material is deformed when the separator is peeled off. As a result, the size of the resin material attached to the first substrate differs from the size of the resin material at the time of being cut.

The present invention has been achieved in view of the above problem, and an aim thereof is to provide a joined body manufacturing method with which the resin material is accurately attached to the first base material.

Solution to Problem

In order to solve the above problem, a joined body manufacturing method according to an aspect of the present invention is a method for manufacturing a joined body composed of a first base material and a second base material joined together by resin material attached to a predetermined area of the first base material, the method comprising: an attaching step of attaching a sheet material to the first base material so as to cover the predetermined area, the sheet material including a sheet base material and the resin material provided on one main surface of the sheet base material; a forming step, after the attaching step, of forming, in the sheet material, a slit for ease of separation in accordance with an outline of the predetermined area; and a separating step of separating, after the forming step, a part of the resin material inside the slit from the sheet base material such that the part of the resin material inside the slit remains on the predetermined area of the first base material and the rest of the resin material outside the slit does not remain on the first base material.

Also, a joined body according to an aspect of the present invention is a joined body formed by joining a first base material and a second base material by using resin material attached to a predetermined area of the first base material, and by cutting the first base material and the second base material along the predetermined area in a direction of thickness of the first base material and the second base material, wherein the first base material includes a first substrate and a functional unit provided on a surface of the first substrate facing the second base material, and on a cut section of the first base material, a protection film is exposed between the first substrate and the resin material, the protection film protecting the first substrate when the resin material is cut in a direction of thickness thereof.

Advantageous Effects of Invention

According to an aspect of the present invention, the sheet material is cut in accordance with an outline of the predetermined area after the sheet material is attached to the first base material, and it is therefore unnecessary to preliminarily cut the resin material in accordance with the outline of the predetermined area and attach the cut resin material to the first base material. For this reason, the deformation of the resin material, which occurs when the cut resin material is attached to the first base material, does not occur. Also, shift in position of the cut resin material does not occur when the cut resin material is attached to the first base material. Therefore, it is possible to more accurately attach the resin material to the first base material than conventional technology.

BRIEF DESCRIPTION OF DRAWINGS

FIG. 9A is an outline view showing the sheet material having perforations, and FIG. 9B is a magnified perspective view of portion E in FIG. 9A.

FIG. 11A is an outline view showing the sheet material having slits, and FIG. 11B is a magnified perspective view of portion Fa in FIG. 11A.

FIG. 12A is an outline view showing the first base material from which the sheet material shown in FIG. 11A has been peeled off and to which peeling tape 71 is attached, and FIG. 12B is a magnified perspective view of portion Fb in FIG. 12A.

FIG. 13A is an outline view showing the sheet material having slits, and FIG. 13B is a magnified perspective view of portion G in FIG. 13A.

FIG. 16A is for explaining the direction in which the perforations are formed, and FIG. 16B shows a resin material attached to the separator when the separator is peeled off.

FIGS. 17A and 17B are for explaining a direction of perforations, and a point on which a power to peel off resin material acts. FIG. 17A shows the case when perforations are formed in a direction of an arrow J, and FIG. 17B shows the case when perforations are formed in a direction of an arrow K.

FIG. 18A is for explaining an area to which the peeling treatment is applied, and FIG. 18B shows a resin material attached to the separator when the separator is peeled.

FIG. 21A is for explaining a method for curing the part, and FIG. 21B shows resin material attached to the separator when the separator is peeled.

FIGS. 23A and 23B show examples of the number of first substrates and a method for attaching a sheet material.

FIGS. 24A and 24B show examples of the number of first substrates and a method for attaching a sheet material.

FIGS. 25A-25C show examples of the number of first substrates and a method for attaching a sheet material.

FIGS. 26A-26J are for explaining conventional technology.

DESCRIPTION OF EMBODIMENTS

[Outline of Embodiments]

Figure 1:
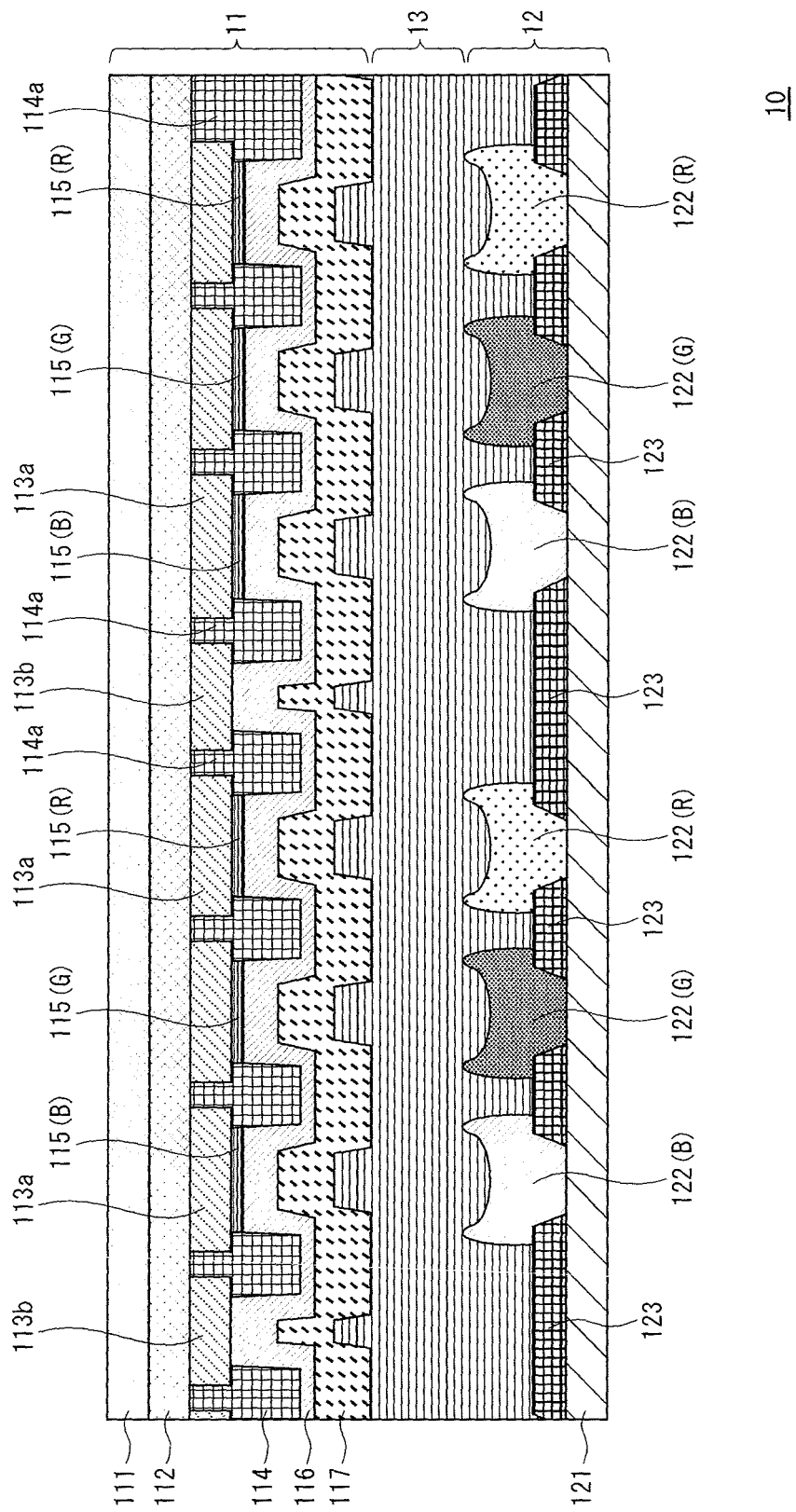
FIG. 1 is a partial cross-sectional view schematically showing primary components of a display panel of Embodiment 1.

A joined body manufacturing method pertaining to the embodiments is a method for manufacturing a joined body composed of a first base material and a second base material joined together by resin material attached to a predetermined area of the first base material, the method comprising: an attaching step of attaching a sheet material to the first base material so as to cover the predetermined area, the sheet material including a sheet base material and the resin material provided on one main surface of the sheet base material; a forming step, after the attaching step, of forming, in the sheet material, a slit for ease of separation in accordance with an outline of the predetermined area; and a separating step of separating, after the forming step, a part of the resin material inside the slit from the sheet base material such that the part of the resin material inside the slit remains on the predetermined area of the first base material and the rest of the resin material outside the slit does not remain on the first base material.

Here, the resin material attached to the one main surface of the sheet base material in the attaching step includes a part of resin material corresponding to the predetermined area of the first base material (attached to the predetermined area) and the rest of the resin material corresponding to an area of the first base material outside the predetermined area (not attached to the predetermined area).

Also, a joined body manufacturing method pertaining to the embodiments is a method for manufacturing a joined body composed of a first base material and a second base material joined together by resin material attached to a predetermined area of the first base material, the method comprising: an attaching step of attaching a sheet material to the first base material so as to cover the predetermined area, the sheet material including a sheet base material and the resin material provided on one main surface of the sheet base material; a forming step, after the attaching step, of forming, in the sheet material, a slit for ease of separation in accordance with an outline of the predetermined area; and a separating step of separating, after the forming step, a part of the resin material inside the slit from the sheet base material such that the part of the resin material inside the slit remains on the predetermined area of the first base material and the rest of the resin material outside the slit does not remain on the first base material.

According to the joined body manufacturing method pertaining to the embodiment, the sheet material has a layer structure of at least the sheet base material and the resin material. Due to the above, the handling of the resin material is facilitated.

According to the joined body manufacturing method pertaining to the embodiments, the sheet material has a two-layer structure, and the resin material has a smaller tensile strength than the sheet base material. Due to the above, it is possible to peel off the sheet material from the first base material and the resin material without breaking the sheet base material.

According to the joined body manufacturing method pertaining to the embodiments, the slit for ease of separation is formed by cutting the sheet material, and the method further comprises a step of forming, before the attaching step, a protection film in an area of the first base material that includes a portion corresponding to a portion of the sheet material that is to be cut. Due to the above, in the forming step, scratches are reduced at a portion of the first substrate corresponding to a portion of the sheet member that is cut.

According to the joined body manufacturing method pertaining to the embodiments, the protection film is formed of metal. Due to the above, scratches are further reduced at the portion of the first substrate corresponding to the portion of the sheet member that is cut.

According to the joined body manufacturing method pertaining to the embodiments, in the forming step, a laser beam is used to form the slit for ease of separation, and the protection film is formed of material that reflects or absorbs the laser beam.

Due to the above, in the forming step, scratches are reduced at the portion of the first substrate corresponding to the portion of the sheet member that is cut.

According to the joined body manufacturing method pertaining to the embodiments, the slit for ease of separation comprises perforations. Due to the above, it is possible to easily separate a part of the resin material inside the slit from the sheet base material such that the part of the resin material inside the slit remains on the predetermined area of the first base material and the rest of the resin material outside the slit does not remain on the first base material.

According to the joined body manufacturing method pertaining to the embodiments, the first base material includes a substrate used for a display panel, and the slit for ease of separation is formed in an area of the substrate in which no image is to be displayed. Due to the above, it is possible to attach the resin material to an area of the substrate corresponding to the display area.

A black matrix is formed at a portion of the substrate corresponding to the area in which no image is to be displayed, and the slit for ease of separation is formed by cutting a portion of sheet material, and the portion is positioned on the black matrix. Since the black matrix is provided at the portion of the first substrate corresponding to the portion of the sheet member that is cut, scratches on the first substrate are reduced in the forming step. Since the black matrix is formed on an area of the substrate in which no image is to be displayed, it is possible to prevent scratches in the area corresponding to the display area of the substrate.

According to the joined body manufacturing method pertaining to the embodiments, the joined body is a display panel composed of a first substrate and a second substrate joined together by resin material, the first substrate is formed on the first base material, and the second substrate is formed on the second base material, the predetermined area of the first base material is on a surface of the first substrate facing the second substrate, in the attaching step, the sheet material is attached such that the resin material faces the first substrate, and the method further comprises a uniting step of uniting, after the separating step, the first base material and the second base material such that the first substrate and the second substrate correspond to each other, and a curing step of curing, after the uniting step, the resin material remaining on the predetermined area of the first base material united with the second base material. Due to the above, it is possible to accurately attach the resin material to the first substrate, and to reduce the distance between the periphery of a display unit that displays images and the periphery of the display panel.

According to the joined body manufacturing method pertaining to the embodiments, the first substrate formed on the first base material is provided in a plurality, and the second substrate formed on the second base material is provided in a plurality, and the second substrates correspond to the first substrates. Due to the above, it is possible to efficiently manufacture the display panel.

According to the joined body manufacturing method pertaining to the embodiments, the first base material has a mark defining a display area of the display panel. Due to the above, it is possible to accurately form the slit for ease of separation in the forming step.

According to the joined body manufacturing method pertaining to the embodiments, in the forming step, the slit for ease of separation is formed by intermittently cutting the sheet material in accordance with a position of the mark. Due to the above, it is possible to accurately form the slit for ease of separation in the forming step.

According to the joined body manufacturing method pertaining to the embodiments, in the forming step, the slit for ease of separation is formed by continuously cutting the sheet material in accordance with a position of the mark, and the method further comprises a peeling step that includes: a step of attaching a peeling member to a part of the sheet base material remaining on the first base material, and a step of peeling the peeling member attached to the sheet base material from the first substrate. Due to the above, it is possible to accurately form the slit for ease of separation in the forming step. Further, it is possible to easily and reliably separate a part of the resin material inside the slit from the sheet base material such that the part of the resin material inside the slit remains on the predetermined area of the first base material and the rest of the resin material outside the slit does not remain on the first base material.

According to the joined body manufacturing method pertaining to the embodiments, in the forming step, a laser beam is used to cut the sheet material. Due to the above, it is possible to easily separate a part of the resin material inside the slit from the sheet base material such that the part of the resin material inside the slit remains on the predetermined area of the first base material and the rest of the resin material outside the slit does not remain on the first base material.

According to the joined body manufacturing method pertaining to the embodiments, a wavelength of the laser beam is a wavelength at which the resin material and the sheet base material absorb the laser beam, and a power of the laser beam is a power that causes each of the resin material and the sheet base material to disperse heat, evaporate or sublime over an entire thickness direction of each of the resin material and the sheet base material. Due to the above, it is possible to reliably cut the sheet base material and the resin material.

According to the joined body manufacturing method pertaining to the embodiments, the laser beam is an infrared laser beam, and the infrared laser beam causes each of the resin material and the sheet base material to disperse heat over an entire thickness direction of each of the resin material and the sheet base material. Due to the above, it is possible to reliably cut the sheet base material and the resin material.

According to the joined body manufacturing method pertaining to the embodiments, the laser beam is a UV laser beam, and the UV laser beam causes each of the resin material and the sheet base material to evaporate or sublime over an entire thickness direction of each of the resin material and the sheet base material. Due to the above, it is possible to reliably cut the sheet base material and the resin material.

According to the joined body manufacturing method pertaining to the embodiments, in the forming step, a blade is used to cut the sheet material. Due to the above, it is possible to easily separate a part of the resin material inside the slit from the sheet base material such that the part of the resin material inside the slit remains on the predetermined area of the first base material and the rest of the resin material outside the slit does not remain on the first base material.

According to the joined body manufacturing method pertaining to the embodiments, in the forming step, the slit for ease of separation is formed in a direction orthogonal to a direction in which the sheet base material is peeled off in plan view, and as a distance between the first base material and a cut section of the slit increases, the cut section is slanted from outside of the predetermined area to inside of the predetermined area. Due to the above, it is possible to easily separate a part of the resin material inside the slit from the sheet base material such that the part of the resin material inside the slit remains on the predetermined area of the first base material and the rest of the resin material outside the slit does not remain on the first base material.

According to the joined body manufacturing method pertaining to the embodiments, the first substrate is a substrate on which a color filter is formed, and the second substrate is a substrate on which an organic EL element is formed. Due to the above, the slit for ease of separation is formed on the sheet material facing the CF substrate, and it is unnecessary to form the slit on the sheet material facing the EL substrate. Note that a substrate on which the color filter is formed is assumed to be a CF substrate, and a substrate on which an organic EL element is formed is assumed to be an organic EL substrate or an EL substrate.

According to the joined body manufacturing method pertaining to the embodiments, the first substrate has a black matrix formed like a belt along an outer circumference of the predetermined area, the color filter is more internally disposed than the black matrix, and an outer circumference of the black matrix coincides with the outer circumference of the predetermined area. Due to the above, it is possible to reliably attach the resin material to the area of the color filter.

According to the joined body manufacturing method pertaining to the embodiments, in the forming step, the sheet material is cut on the black matrix. At this point in time, the black matrix functions as a protection film for protecting the first substrate, and reduces scratches on the first substrate.

According to the joined body manufacturing method pertaining to the embodiments, after the curing step, the first base material and the second base material in a joined state are cut out along a track remaining on the black matrix on which the sheet material has been cut. Due to the above, it is possible to prevent a scratch from remaining on the black matrix of the display panel as a finished product.

According to the joined body manufacturing method pertaining to the embodiments, the first base material and the second base material in a joined state are cut out at a portion of the black matrix inside the track. Due to the above, it is possible to prevent the track from remaining on the black matrix of the display panel as a finished product.

The joined body manufacturing method pertaining to the embodiments further includes a step of forming a release film outside the predetermined area on the first base material. Due to the above, it is possible to easily separate a part of the resin material inside the slit from the sheet base material such that the part of the resin material inside the slit remains on the predetermined area of the first base material and the rest of the resin material outside the slit does not remain on the first base material.

Also, a joined body pertaining to the embodiment is a joined body formed by joining a first base material and a second base material by using resin material attached to a predetermined area of the first base material, and by cutting the first base material and the second base material along the predetermined area in a direction of thickness of the first base material and the second base material, wherein the first base material includes a first substrate and a functional unit provided on a surface of the first substrate facing the second base material, and on a cut section of the first base material, a protection film is exposed between the first substrate and the resin material, the protection film protecting the first substrate when the resin material is cut in a direction of thickness thereof. Due to the above, it is possible to prevent the first base substrate from being damaged when the resin material is cut in accordance with the predetermined part.

Also, according to a joined body pertaining to the embodiments, the second base material includes a second substrate and a light-emitting unit, the light-emitting unit having a plurality of light-emitting elements differing from one another in color on a surface of the second substrate facing the first base material, the functional unit includes a plurality of color filters disposed in correspondence to the light-emitting elements, and a black matrix disposed between the color filters, and the protection film is formed of the same material as the black matrix. Due to the above, it is possible to provide the protection layer at the same time as when the black matrix is formed.

[Embodiments]

The following describes the joined body manufacturing method and the joined body pertaining to embodiments of the present invention with reference to the drawings. No particular limitation is intended regarding the materials and quantities thereof used in the present invention as described in the exemplary embodiment. The exemplary embodiment may be optionally modified, as appropriate, and combined with other embodiments, provided that the technical scope of the disclosure is not exceeded in doing so, and that no contradictions result.

[Embodiment 1]

In the present embodiment, a display panel is described as an example of a joined body.

In the field of display devices such as an EL display device and a liquid crystal display device, there is a demand for increase of an area occupied by a display unit (screen) with respect to the area of the display device viewed from the front (of the screen). That is, there is a demand for decrease of the distance between the periphery of the display unit and the periphery of the display device (the width of a frame of the display device), i.e., a demand for frame narrowing.

The display panel of the EL display device is formed by attaching a resin material supplied as a sheet material to a surface of an EL substrate or a CF substrate described below, uniting the EL substrate to the CF substrate, and joining the EL substrate and the CF substrate by using the resin material.

If the technology described in the background art section is used when manufacturing such a display panel, it is impossible to accurately attach the sheet material to the EL substrate or the CF substrate functioning as a substrate body, and it is therefore impossible to meet the above demand for frame narrowing.

To be specific, in order to meet the demand for frame narrowing, attaching accuracy of the sheet material to the substrate (EL substrate or CF substrate) needs to be 100 μm order, while according to the technology described in the background art section, attaching accuracy thereof is 1 mm order.

The following describes an EL display panel (hereinafter, simply referred to as "display panel").

1. Structure
(1) Overall configuration

FIG. 1 is a partial cross-sectional view schematically showing primary components of a display panel 10 of Embodiment 1.

As shown in FIG. 1, the display panel 10 includes an EL substrate 11 and a CF substrate 12, and a sealing resin layer 13 is interposed between the EL substrate 11 and the CF substrate 12.

The sealing resin layer 13 is formed by curing the above-described resin material supplied as the sheet material. The sealing resin layer 13 is provided in order to join the EL substrate 11 and the CF substrate 12, as well as to prevent the intrusion of water, gases, and other outside elements into the EL substrate 11.

Let the light output surface of the display panel 10 be the top or upper surface thereof, which corresponds to the bottom of the display panel 10 in FIG. 1.

(2) EL Substrate

The EL substrate 11 is made up of a substrate body, an inter-layer insulating film, anodes, banks, light-emitting layers, and so on.

Figure 2:
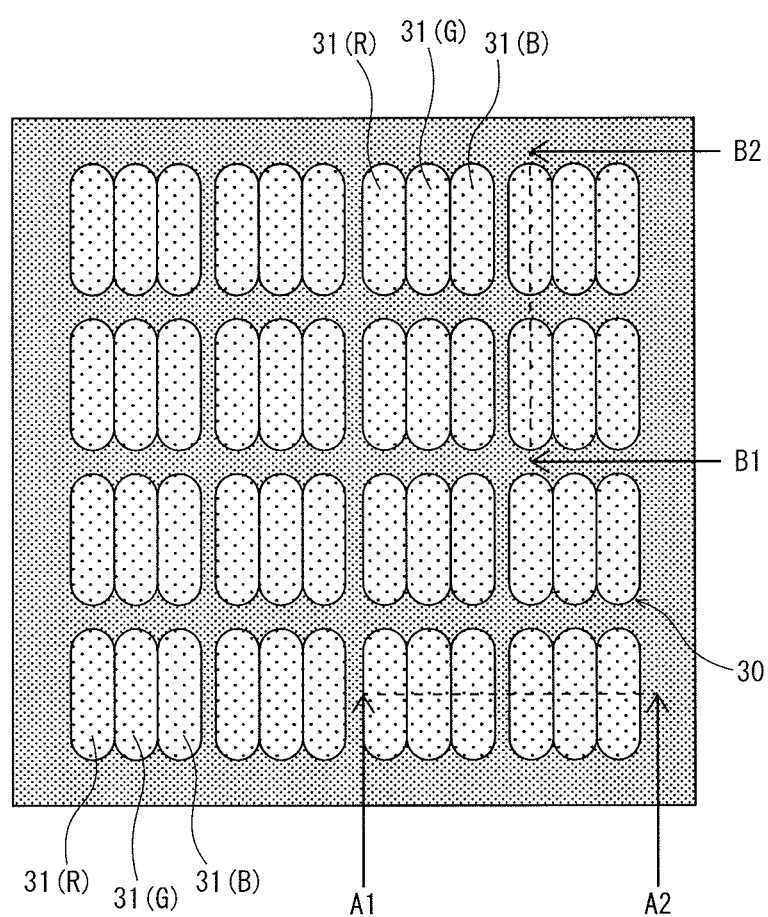
FIG. 2 is a plan view of an EL substrate.
Figure 3:
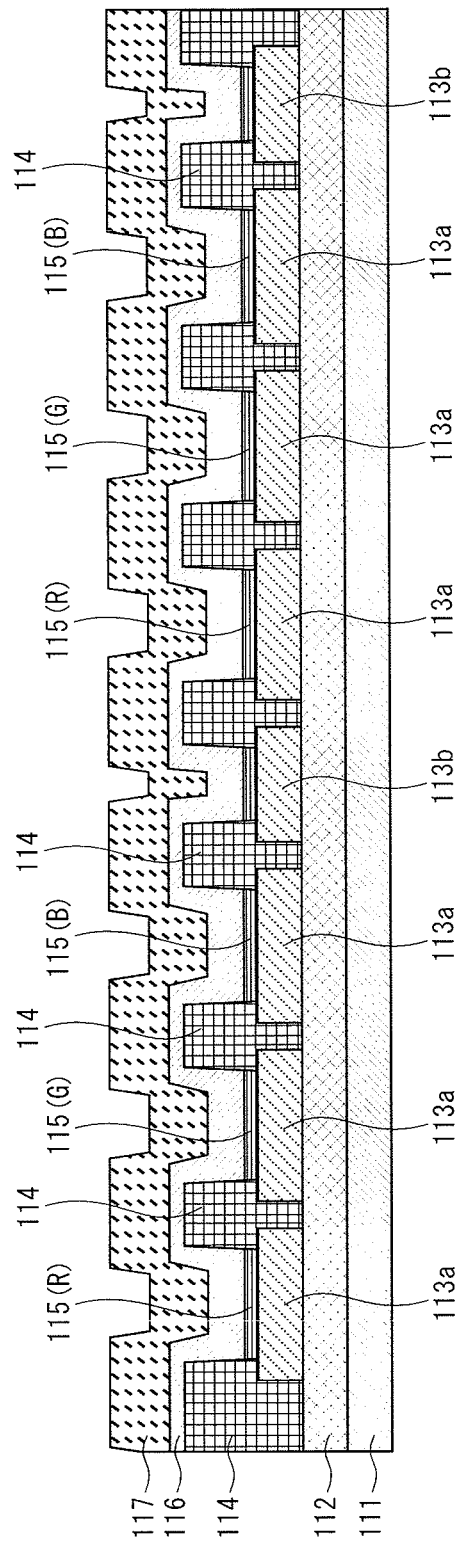
FIG. 3 is a cross-sectional diagram taken along line A1-A2 of FIG. 2.
Figure 4:
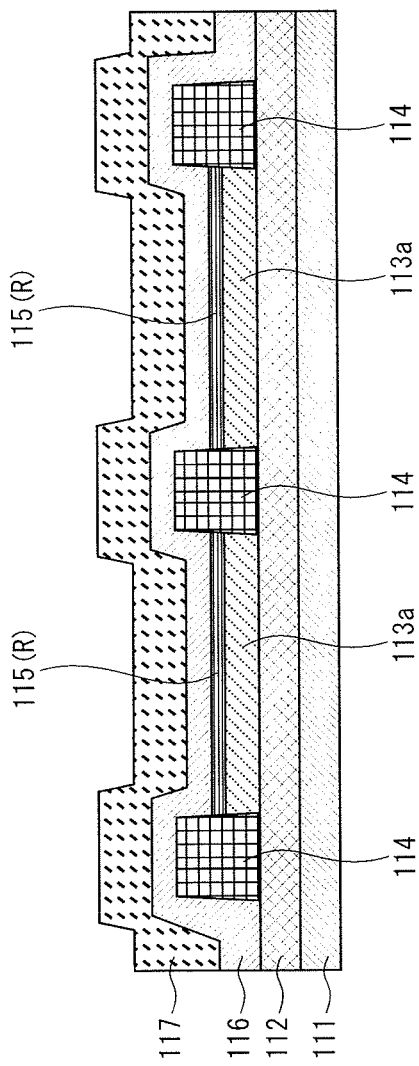
FIG. 4 is a cross-sectional diagram taken along line B1-B2 of FIG. 2.

FIG. 2 is a plan view of the EL substrate. FIG. 3 is a cross-sectional diagram taken along line A1-A2 of FIG. 2. FIG. 4 is a cross-sectional diagram taken along line B1-B2 of FIG. 2.

The top or upper surface of the EL substrate 11 is the surface thereof united to the CF substrate 12 (the downside of the EL substrate in FIG. 1).

The EL substrate 11 has a plurality of pixels 30 arranged in a matrix along the surface of a substrate body (111). Each one of the pixels 30 is made up of three light-emitting elements (in three colors (R, G, and B)) 31 (R), 31 (G), and 31(B). Reference sign 31 hereinafter denotes the light-emitting elements in generality, without regard for the color emitted thereby.

Each of the light-emitting elements 31 is elongated. The three light-emitting elements 31(R), 31(G), and 31(B) are aligned in the widthwise direction of the light-emitting elements 31 such that each of the pixels 30 forms an approximate square when viewed in the plane (see FIG. 2).

The following explanations primarily reference FIGS. 2-4.

A TFT substrate 111 serves as the substrate body. An inter-layer insulating film 112 is formed on the top surface of the TFT substrate 111.

An anode 113a is disposed at the top surface of the inter-layer insulating film 112 for each of the light-emitting elements 31. Each anode 113a is shaped so as to be elongated, like the light-emitting elements 31 as seen in the plane view. As shown in FIGS. 3 and 4, other than the anodes 113a, auxiliary electrodes 113b are formed at the top surface of the inter-layer insulating film 112 between the pixels 30.

A bank 114 is formed between any two neighboring anodes 113a and between any given anode 113a and neighboring auxiliary electrode 113b. Each bank 114 extends upward from an area on the inter-layer insulating film 112 where no anode 113a or auxiliary electrode 113b is formed so as to pass between the anodes 113a and the auxiliary electrodes 113b.

A light-emitting layer emitting light of a predetermined color (here, an organic light-emitting layer) 115, is layered over each anode 113a within a region defined by the banks 114 (i.e., surrounded by the banks 114).

The predetermined color is three colors, i.e., "blue", "green" or "red". However, another color different from these three colors, e.g., yellow, may be included. In FIG. 3, the blue light-emitting layer is represented by "115(B)", the green light-emitting layer is represented by "115(G)", and the red light-emitting layer is represented by "115(R)". Reference sign 115 hereinafter denotes the light-emitting layers in generality, without regard for the color emitted thereby.

A cathode 116 and a sealing layer 117 are respectively formed on the organic light-emitting layer 115 so as to traverse the areas defined by the banks 104 and extend over the neighboring organic light-emitting layers 115 and auxiliary electrodes 113b. The sealing layer 117 serves to prevent the exposure of the organic light-emitting layers 115 and so on to water and air.

(3) CF Substrate

Figure 5:
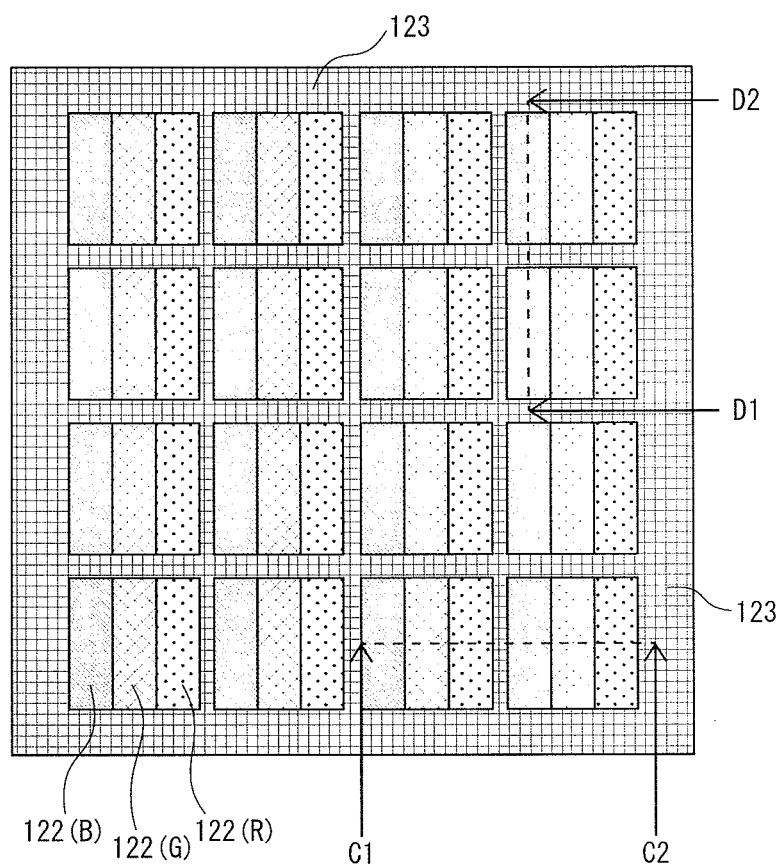
FIG. 5 is a plan view of a CF substrate.
Figure 6:
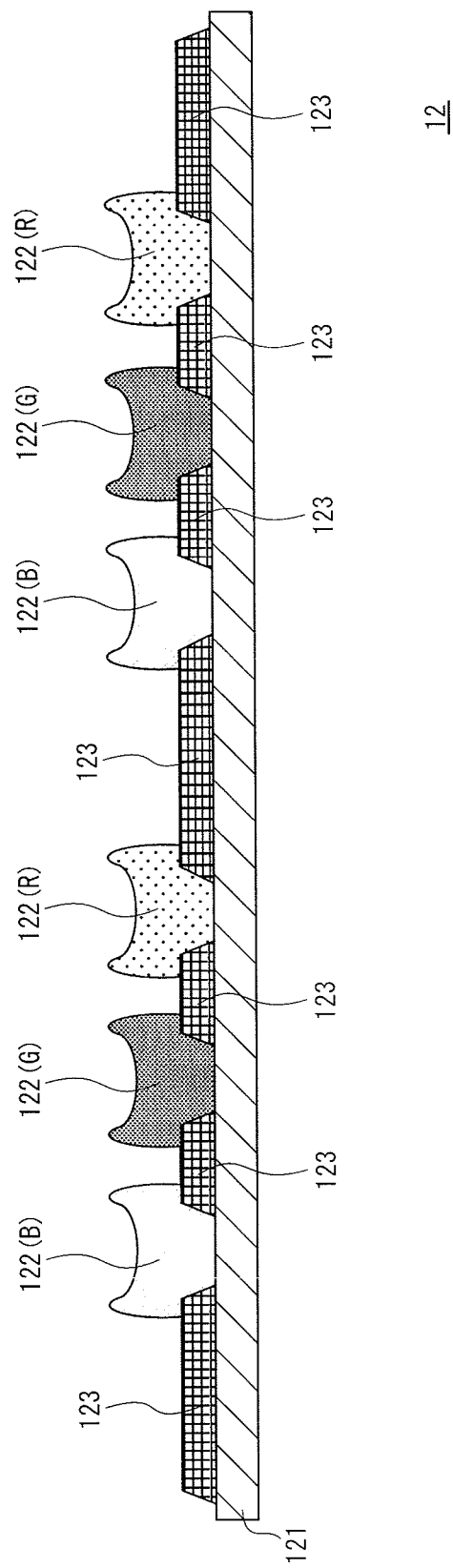
FIG. 6 is a cross-sectional diagram taken along line C1-C2 of FIG. 5.
Figure 7:
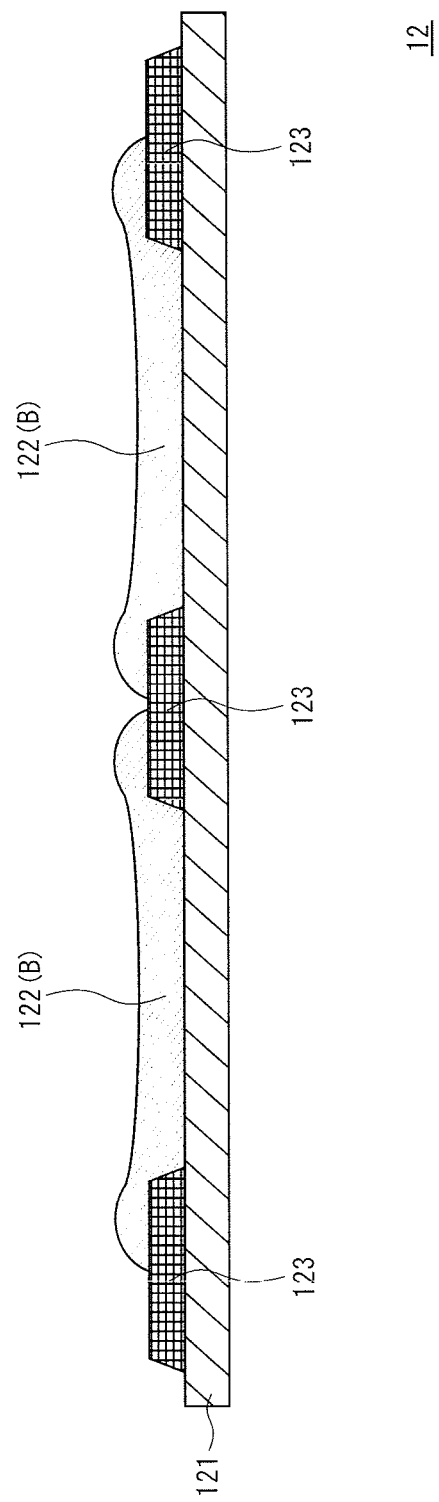
FIG. 7 is a cross-sectional diagram taken along line D1-D2 of FIG. 5.

FIG. 5 is a plan view of a CF substrate. FIG. 6 is a cross-sectional diagram taken along line C1-C2 of FIG. 5. FIG. 7 is a cross-sectional diagram taken along line D1-D2 of FIG. 5.

The top or upper surface of the CF substrate 12 is the surface thereof united to the EL substrate 11 (the upside of the CF substrate in FIG. 1).

The CF substrate 12 includes a substrate body 121, color filters 122, and so on.

As shown in FIG. 5, each of the color filters 122 is elongated when viewed in the plane, similar to the light-emitting elements 31 illustrated by FIG. 2.

The following explanations primarily reference FIGS. 4, 6 and 7.

The substrate body 121 is the frontal substrate of the display panel 10, and is made of a light-transmissive material. Color filters 122 (B), 122 (G), and 122 (R) are formed on the top surface of the substrate body 121, respectively corresponding to the organic light-emitting layers 115 (B), 115 (G), and 115 (R) of the EL substrate 11. Reference sign 122 hereinafter denotes the color filters in generality, without regard for emitted color.

A black matrix (hereinafter abbreviated "BM") 123 is arranged at the top surface of the substrate body 121 between the color filters 122. As shown in FIGS. 6 and 7, each of the color filters 122 is shaped so as to partly overlap the top circumferential edge of the neighboring BM 123 to each side.

The BM 123 is a black layer provided to improve display contrast by preventing external light from irradiating or shining on the display surface of the display panel 10. As shown in FIG. 1, the BMs 123 are formed to correspond to (i.e., to oppose) positions of the banks 114 of the EL substrate 11.

2. Manufacturing Method

The display panel 10 is manufactured by a step of preparing the EL substrate 11, a step of preparing the CF substrate 12, and a step of uniting the prepared EL substrate 11 and the CF substrate 12.

The steps of preparing the EL substrate 11 and the CF substrate 12 are the same as conventional steps, and the descriptions thereof are omitted.

In the following description, a resin material 63 used for the sealing resin layer 13 is attached to the CF substrate 12 when the EL substrate 11 and the CF substrate 12 are united (that is, case where the first base material or the first substrate of the present invention is the CF substrate). However, the resin material may be attached to the EL substrate (that is, case where the first base material or the first substrate of the present invention is the EL substrate).

The step of uniting the EL substrates 11 to the CF substrates 12 includes the following sub-steps: an attaching sub-step of attaching the resin material 63 of the sheet material 61 to the CF substrates 12 (steps (h) and (c) described below, FIGS. 8B and 8C); a slit forming sub-step of forming slits for ease of separation (65) on the sheet material 61 attached to the CF substrates 12, in accordance with an outline of predetermined areas (areas to which the resin material 63 is attached when the EL substrates 11 and the CF substrates 12 are joined by using the resin material 63) (step (d) described below, FIG. 8D); and a separating sub-step of separating interior portions of the resin material from the separator such that, taking the slits (65) to be borders, the interior portions of the resin material 63 remain on the predetermined areas of the CF substrates 12 and an exterior portion of the resin material 63 does not remain on the CF substrates 12 (step (e) described below, FIG. 8E). The following uses the first base material 52 and the second base material 54 on which a plurality of EL substrates 11 and a plurality of CF substrates 12 are respectively formed.

FIGS. 8A-8H illustrate a method of manufacturing the display panel of Embodiment 1.

FIGS. 8A-8H schematically show distinctive states in a plurality of steps. Each figure has an upper perspective view (hatching may be provided at portions that are not cross-section in order to distinguish one member from another, to improve visibility) and a lower cross-sectional view (hatching is omitted to improve visibility).

The sheet member 61 has the resin material 63 and two separators (corresponding to "sheet base material" of the present invention) 62 and 64 that sandwich the resin material 63. Note that the sheet material 61 refers to a material composed of the two separators 62 and 64 and the resin material 63, but even after one of the separators (e.g., separator 64) is peeled off during the manufacturing process, the remaining material is also referred to as the sheet material 61.

The slits (65) are for ease of separation. Here, intermittent perforations 65 are used as the slits. The perforations 65 are formed by using a utility blade or a laser beam, or formed by punching, for example. Here, a utility blade is used.

With reference to FIGS. 8A-8H, the method of manufacturing the display panel 10 specifically includes the following steps.

Figure 8A:
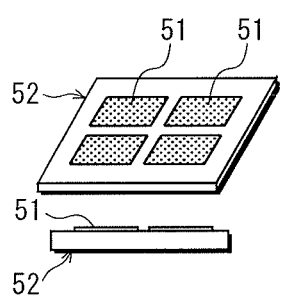
FIGS. 8A-8H illustrate a method of manufacturing the display panel pertaining to Embodiment 1.
Figure 8B:
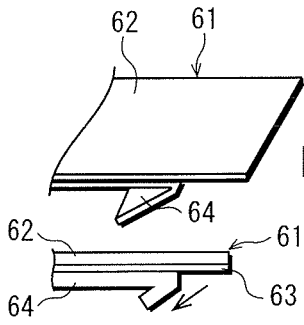

(a) Preparing the first base material 52 having a plurality of CF substrates 51 (in this case, the number of CF substrates is four, but may be one as described below) functioning as first substrates, and performing UV ozone cleaning, for example (FIG. 8A).

Figure 8C:
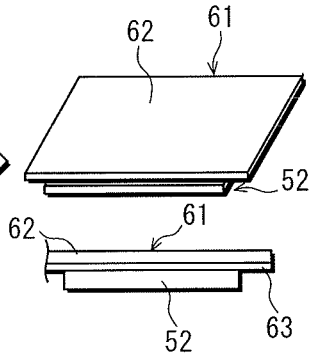

(b) Preparing the sheet material 61, and peeling off a separator (here, a lower separator) 64 on the side of the sheet material 61 that is to be attached to the first base material 52 (FIG. 8B); and (c) Attaching the sheet material 61 from which the lower separator 64 is peeled off to the first base material 52 such that the resin material 63 faces the first base material 52 (FIG. 8C).

In this case, the sheet material 61 has only to be attached to the predetermined areas on the first base material 52 to which the resin material 63 is to be attached, and it is unnecessary to precisely position the resin material 63 compared to the case of attaching the resin material 63 that is cut in accordance with an outline of each predetermined area and attaching the cut resin material 63 to the predetermined area.

Figure 8D:
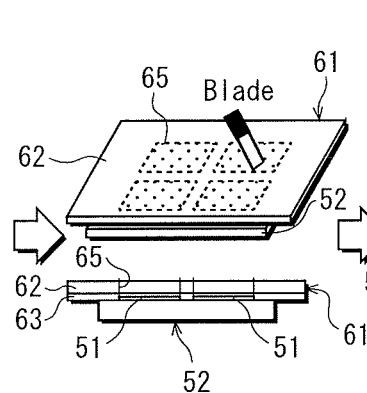

(d) Forming the perforations 65 in the sheet material 61 attached to the first base material 52 in conformity with the size and shape (outer edges of the resin material) of the predetermined areas of the resin material 63 that is to be attached to the upper surfaces of the CF substrates 51 (FIG. 8D). An angle of the blade at which the perforations 65 are formed is described below.

In this case, since the perforations 65 are formed after the sheet material 61 is attached to the first base material 52, it is unnecessary to take into consideration the deformation of the sheet material 61 that occurs when the sheet material 61 is attached to the first base material 52, and the perforations 65 are formed on the sheet material 61 at a high degree of accuracy.

The perforations 65 are formed in a square shape along the four sides of each CF substrate 51. The perforations 65 are discontinuous slits formed in the main surface of the sheet material 61 (to be exact, on the separator 62 and the resin material 63) in the direction of thickness thereof. The size of perforations 65 (the length of slits) is set such that when the separator 62 is peeled off, only parts of the resin material 63 surrounded by the perforations 65 remain on the upper surfaces of the CF substrates 51, and the remaining part of the resin material 63 outside the predetermined areas on the upper surfaces of the CF substrates 51 is peeled off along with the separator 62.

Figure 8E:
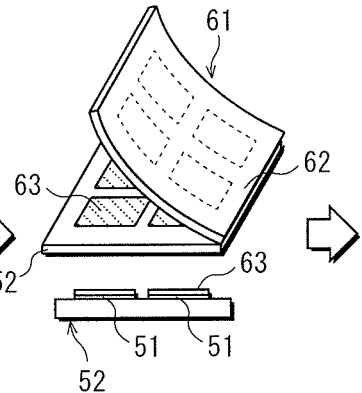

(e) Peeling off the sheet material 61 on which the perforations 65 are formed from the first base material 52 (FIG. 8E). After the sheet material 61 is peeled off, only the parts of the resin material 63 remain on the predetermined areas on the upper surfaces of the CF substrates 51 due to the perforations 65 of the sheet material 61, and the remaining part of the resin material 63 outside the predetermined areas is peeled off along with the sheet material 61 without remaining on the CF substrates 51.

At this point, the parts of the resin material 63 inside the predetermined areas are fixed by the perforations 65 formed at areas corresponding to the outer edges (borders) of the predetermined areas and closely attached to the CF substrates 51, and are unlikely to be deformed when the separator 62 is peeled off.

Also, since the resin material 63 is cut at the areas where the perforations 65 are formed, the parts of the resin material 63 remaining on the first base material 52 correspond to the predetermined areas in size, and as a result, the parts of the resin material 63 are accurately attached to the CF substrates 51.

Figure 8F:
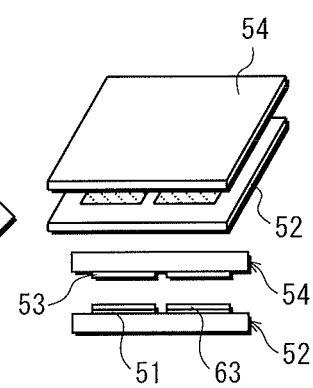
Figure 8G:
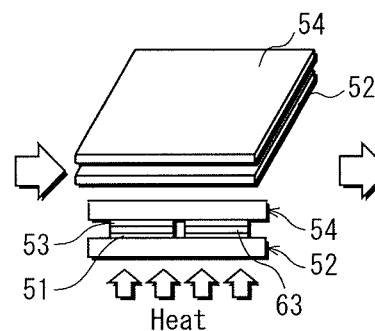

(f) Preparing the second base material 54 on which the same number of the second substrates as the CF substrates 51 of the first base material 52 are formed as the second substrates, and uniting the second base material 54 to the first base material 52 such that the CF substrates 51 and the EL substrates 53 correspond to each other (FIG. 8F). The second base material 54 may be cleaned after preparation, or may be prepared after cleaning.

Figure 8H:
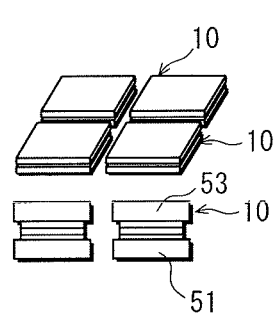

(g) Curing the resin material 63 by heating (or applying UV to) the united first base material 52 and second base material 54 (FIG. 8G); and (h) Dividing the joined EL substrates 11 and CF substrates 12 from the joined first substrates 52 and second substrates 54 into individual substrates, after curing the resin material 63 (FIG. 8H). The display panel 10 is thus obtained.

In the above manufacturing method, in particular, in the step of uniting the EL substrates 11 and the CF substrates 12, the perforations (slits) 65 are formed after the resin material 63 as the sheet material 61 is attached to the CF substrates 12. Therefore, even if the resin material 63 is deformed when the sheet material 61 is attached, the perforations 65 are formed on the deformed resin material 63, and as a result, it is possible to accurately cut the resin material 63, and to accurately attach the cut resin material 63 to the first base material 52.

3. Characteristics of Sheet Material (1) Adhesive Force

In order that parts of the resin material 63 of the predetermined areas of the sheet material 61 are attached to the first base material 52 and part of the resin material 63 outside the predetermined areas remains on the sheet material 61, the sheet material 61 and the first base material 52 need to satisfy the following relation.

Figure 9A:
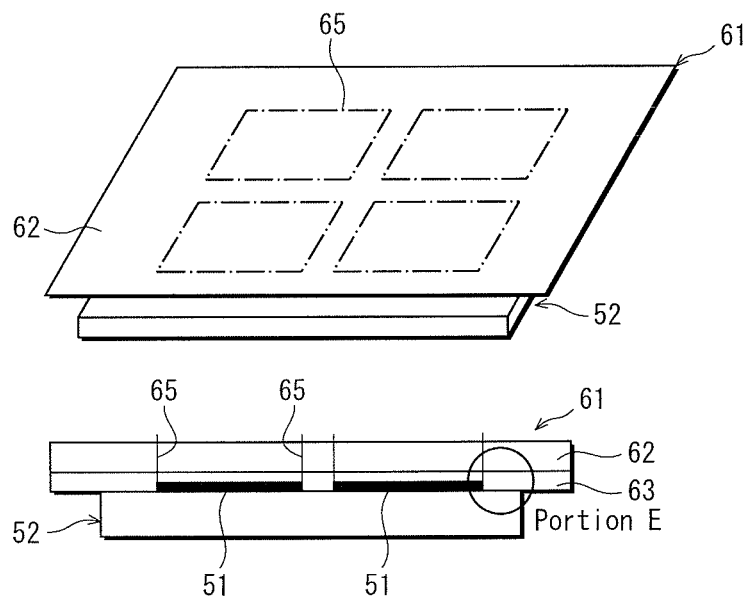
FIGS. 9A and 9B are for explaining characteristics of a sheet material.
Figure 9B:
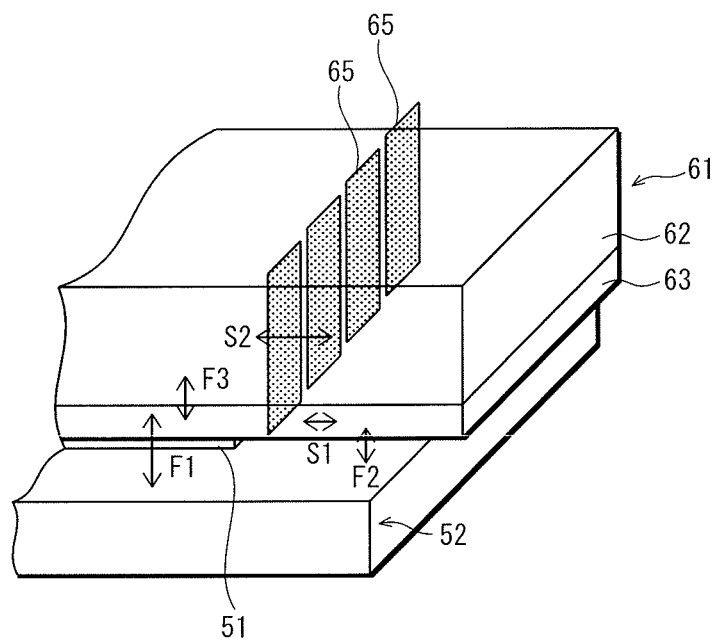

FIGS. 9A and 9B are for explaining characteristics of a sheet material. FIG. 9A is an outline view showing the sheet material having perforations, and FIG. 9B is a magnified perspective view of portion E in FIG. 9A.

As shown in FIG. 9A, the sheet material 61 with the lower separator peeled off is attached to the upper surface of the first base material 52, and the perforations 65 are formed on the sheet material 61.

As shown in FIG. 9B, letting an adhesive force between the CF substrates 51 formed on the first base material 52 and the resin material 63 be "F1", letting an adhesive force between an area of the upper surface of the first base material 52 not having the CF substrates 51 (this area may include the predetermined areas of the CF substrates) and the resin material 63 be "F2", and letting an adhesive force between the separator 62 and the resin material 63 be "F3", the following relation holds among these adhesive forces.

$$F1 > F3 > F2 \quad \text{(Expression 1)}$$

The adhesive force of the resin material 63 is affected by material to which the resin material 63 is attached. In Embodiment 1, the adhesive force F1 between the resin material 63 and the upper surfaces of the CF substrates 51 is greater than the adhesive force F2 between the resin material 63 and the upper surface of the first base material 52 in which the CF substrates 51 are not formed.

Further, even if there is no difference between the adhesive force between the resin material 63 and the CF substrates 51 and the adhesive force between the resin material 63 and the first base material 52, the CF substrates 51 protrude from the upper surface of the first base material 52, and therefore there is a gap between the resin material 63 and the first base material 52 when the sheet material 61 is attached. As a result, the adhesive force F1 between the resin material 63 and the upper surface of the CF substrates 51 is greater than the adhesive force F2 between the resin material 63 and the upper surface of the first base material 52.

Satisfying the above-stated Expression 1 allows the parts of the resin material 63 inside the predetermined areas surrounded by the perforations 65 to be closely attached to the CF substrates 51, and allows the part of the resin material 63 outside the predetermined areas to be closely attached to the separator 62.

(2) Mechanical Characteristics

Regarding mechanical characteristics of the sheet material 61, letting a tensile strength of the resin material 63 be S1, and letting a tensile strength of the separator 62 be S2, the following relation holds between these tensile strengths.

$$S2 > S1 \quad \text{(Expression 2)}$$

Since Expression 2 is satisfied, when the sheet material 61 is peeled off from the first base material 52, a tensile stress acts on the separator 62 and the resin material 63. The resin material 63 has not been cured and has the small strength. Therefore, the resin material 63 is easily torn off (cut). In contrast, the separator 62 has the greater strength than the resin material 63, and is not torn off (cut) prior to the resin material 63.

Therefore, when the separator 62 is peeled off, the parts of the resin material 63 of the predetermined areas surrounded by the perforations 65 remain on the first base material 52. Although the resin material 63 is deformed when the sheet material 61 is peeled off, the perforations 65 restrain the deformation, and there is little effect on positional accuracy of the resin material 63 with respect to the first base material 52.

Embodiment 2

In Embodiment 1, the perforations 65 are used as the slits for ease of separation, but in Embodiment 2, slits 66 are used. The perforations 65 are intermittent slits, and the slits 66 pertaining to Embodiment 2 are different from the perforations 65 in that the slits 66 are continuous. That is, the slits 66 pertaining to Embodiment 1 are intermittent (perforations), and the slits 66 pertaining to Embodiment 2 are continuous.

The slits 66 are formed by using a utility blade or a laser beam, or formed by punching, for example. Here, a laser beam is used.

1. Manufacturing Method

The display panel 10 is manufactured by a step of preparing the EL substrate 11, a step of preparing the CF substrate 12, and a step of uniting the prepared EL substrate 11 and the CF substrate 12.

The step of uniting the EL substrates 11 to the CF substrates 12 includes the following sub-steps: an attaching sub-step of attaching the resin material 63 of the sheet material 61 to the CF substrates 12 (steps (2b) and (2c) described below, FIGS. 10B and 10C); a slit forming sub-step of forming slits (66) on the sheet material 61 attached to the CF substrates 12 (step (2d) described below, FIG. 10D); and a separating sub-step of separating, from the first base material 52, part of the resin material 63 outside the predetermined areas of the CF substrates 12 such that only parts of the resin material 63 inside the predetermined areas remain (step (2e) described below, FIG. 10E).

FIGS. 10A-10J illustrate a method of manufacturing the display panel of Embodiment 2.

Note that FIGS. 10A-10J schematically show distinctive states in a plurality of steps, as in FIGS. 8A-8H in Embodiment 1. Each figure has an upper perspective view (hatching may be provided at portions that are not cross-section in order to distinguish one member from another, to improve visibility) and a lower cross-sectional view (hatching is omitted to improve visibility).

Structural elements that are the same as those in Embodiment 1 bear the same reference signs, and the descriptions thereof are omitted. Further, provisos described in Embodiment 1 are also applied to Embodiment 2, and the descriptions thereof are omitted.

With reference to FIGS. 10A-10J, the method of manufacturing the display panel 10 specifically includes the following steps.

Figure 10A:
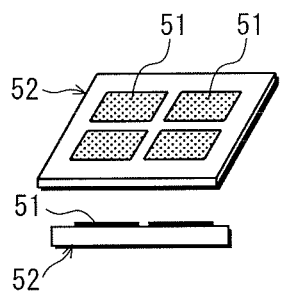
FIGS. 10A-10J illustrate a method of manufacturing a display panel of Embodiment 2.

(2a) Preparing the first base material 52, on which a plurality of the CF substrates 51 functioning as the first substrates are formed, and performing UV ozone cleaning, for example (FIG. 10A).

Figure 10B:
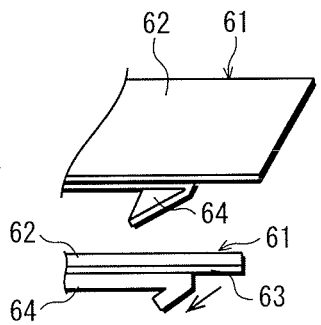

(2b) Preparing the sheet material 61, and peeling off a separator (here, a lower separator) 64 on the side of the sheet material 61 that is to be attached to the first base material 52 (FIG. 10B).

Figure 10C:
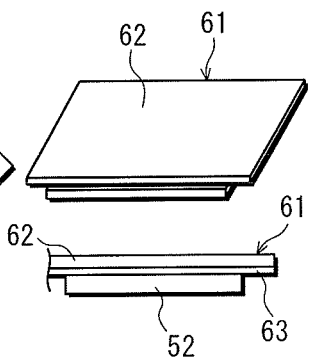

(2c) Attaching the sheet material 61 from which the lower separator 64 is peeled off to the first base material 52 such that the resin material 63 faces the first base material 52 (FIG. 10C).

Figure 10D:
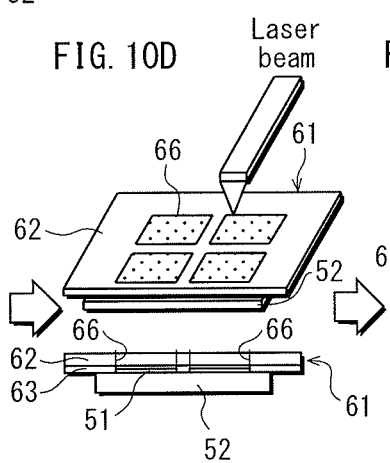

(2d) Forming the slits 66 in the sheet material 61 attached to the first base material 52 in conformity with the size and shape of the predetermined areas (FIG. 10D).

In this case, since the slits 66 are formed at areas corresponding to the outer edges (borders) of the predetermined areas, it is possible to accurately form the slits 66 along the predetermined areas.

Figure 10E:
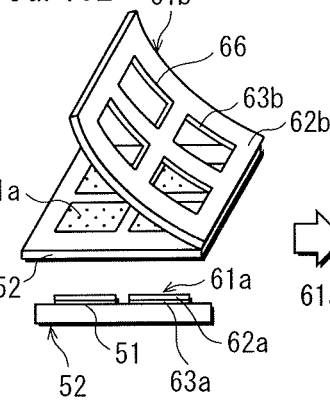

(2e) Peeling off the sheet material 61 in which the slits 66 are formed from the first base material 52 (FIG. 10E). After the sheet material 61 is peeled off, only sheet material parts 61a (to be exact, parts of the separator 62 and parts of the resin material 63) of the predetermined areas defined by the slits 66 remain on the upper surfaces of the CF substrates 51 due to the slits 66 formed on the sheet material 61.

At this point, due to the slits 66 formed in correspondence to the outline of the predetermined areas, resin material parts 63a are hardly deformed when the sheet material 61 is peeled off, and the sheet material parts 61a inside the predetermined areas and a sheet material part 61b outside the predetermined areas are easily separated from each other.

Also, the sheet material parts 61a are cut from the remaining part at the areas where the slits 66 are formed, and the sheet material parts 61a remaining on the first base material 52 correspond to the predetermined areas in size. As a result, the sheet material parts 61a are accurately attached to the CF substrates 51.

Figure 10F:
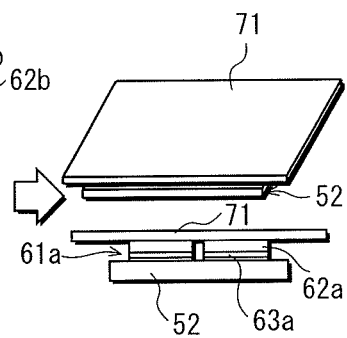

(2f) Attaching peeling tape 71 to the upper surfaces of the sheet material parts 61a on the first base material 52 to remove separator parts 62a from the resin material parts 63a (FIG. 10F).

Figure 10G:
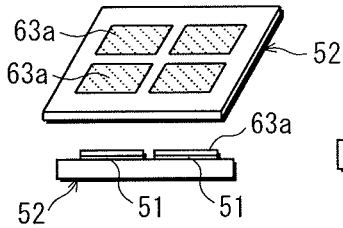

(2g) Removing the separator parts 62a from the resin material parts 63a by peeling off the peeling tape 71 (FIG. 10G).

Figure 10H:
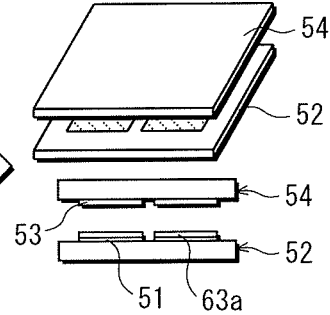

(2h) Uniting the second base material 54 and the first base material 52 such that the CF substrates 51 of the first base material 52 and the EL substrates 53 of the second base material 54 correspond to each other (FIG. 10H).

Figure 10I:
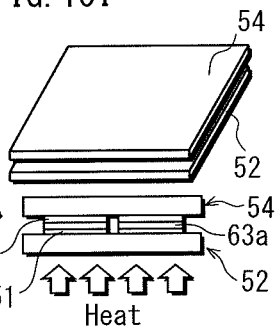

(2i) Curing the resin material parts 63a by heating the united first base material 52 and second base material 54 (FIG. 10I).

Figure 10J:
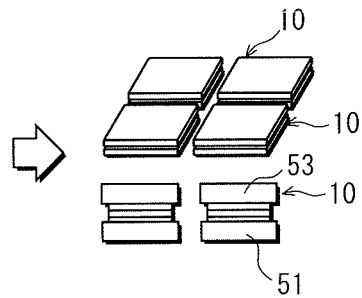

(2j) Dividing the joined EL substrates 11 and the CF substrates 12 from the joined first base material 52 and the second base material 54 into individual substrates after curing the resin material parts 63a (FIG. 10J). The display panel 10 is thus obtained.

In the above manufacturing method, in particular, in the step of uniting the EL substrates 11 and the CF substrates 12, slits (for ease of separation) 66 are formed after the resin material 63 as the sheet material 61 is attached to the CF substrate 12. Therefore, even if the resin material 63 is deformed when the sheet material 61 is attached, the slits 66 are formed in the deformed resin material 63, and as a result, it is possible to accurately cut the resin material parts 63a, and to accurately attach the cut resin material parts 63 to the first base material 52.

2. Characteristics of Sheet Material (2-1) When Resin Material Outside Predetermined Areas does not Remain The sheet material 61 is attached to the first base material 52, and the separator parts 62a of the sheet material parts 61a in the predetermined areas are peeled off with the use of the peeling tape 71. At this point, in order to remove the resin material part 63b outside the predetermined areas while leaving the resin material parts 63a inside the predetermined areas of the sheet material 61 defined by the slits 66 on the first base material 52, the sheet material 61, the first base material 52 and the peeling tale 71 need to satisfy the following relation.

Figure 11A:
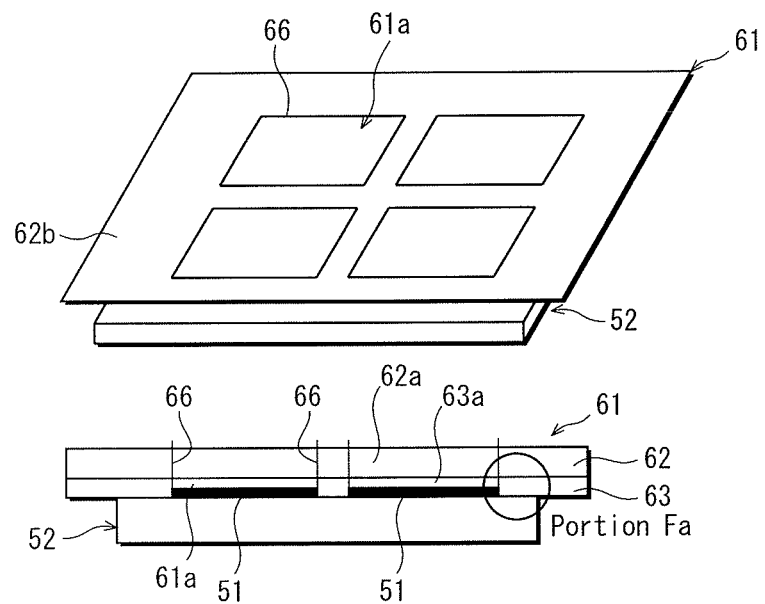
FIGS. 11A and 11B are for explaining characteristics of a sheet material.
Figure 11B:
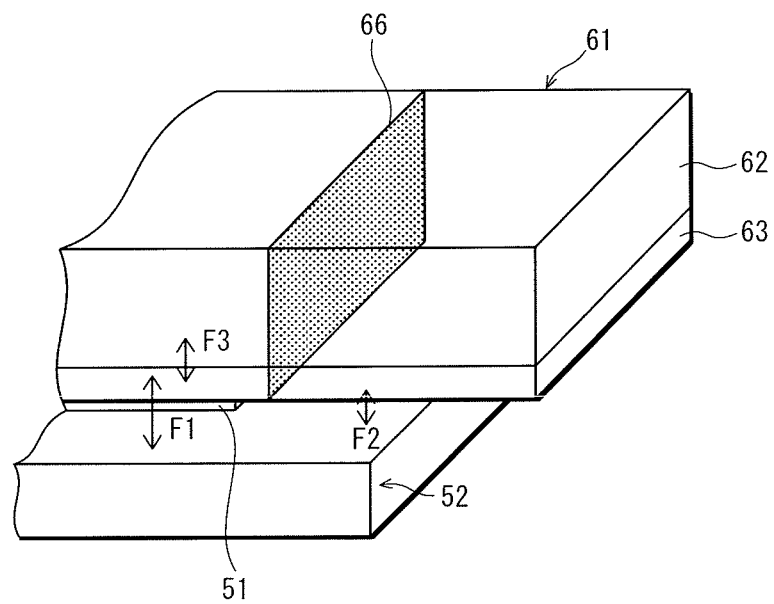

FIGS. 11A and 11B are for explaining characteristics of a sheet material. FIG. 11A is an outline view showing the sheet material having slits, and FIG. 11B is a magnified perspective view of portion Fa in FIG. 11A.

First, in order that the sheet material 61 is peeled off from the first base material 52 such that the sheet material parts 61a inside the predetermined areas defined by the slits 66 remain on the first base material 52 and the resin material part 63b outside the predetermined areas do not remain, letting an adhesive force between the resin material 63 and the CF substrates 51 of the first base material 52 be "F1", letting an adhesive force between the resin material 63 and an area of the first base material 52 on which the CF substrates 51 are not formed be "F2" (see FIG. 9B), and letting an adhesive force between the separator 62 and the resin material 63 be "F3", the following relation holds among these adhesive forces.

$$F1 > F3 > F2 \quad \text{(Expression 3)}$$

Figure 12A:
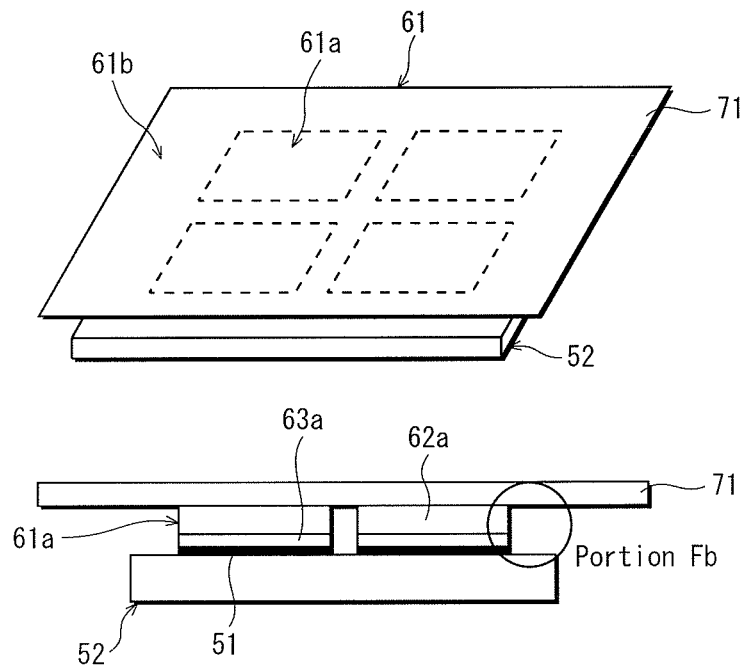
FIGS. 12A and 12B are for explaining characteristics of a sheet material and peeling tape.
Figure 12B:
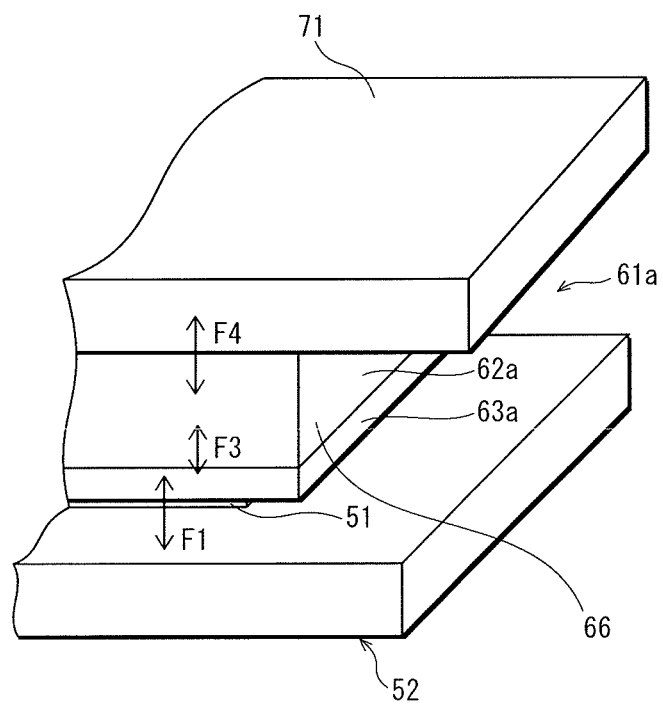

Next, FIGS. 12A and 12B are for explaining characteristics of a sheet material and peeling tape. FIG. 12A is an outline view showing the first base material from which the sheet material shown in FIG. 11A has been peeled off and to which peeling tape 71 is attached, and FIG. 12B is a magnified perspective view of portion Fb in FIG. 12A.

In order that the resin material parts 63a are not peeled off and only the separator parts 62a are peeled off by the peeling tape 71 in the predetermined areas, the sheet material parts 61a and the peeling tape 71 need to satisfy the following relation, letting an adhesive force between the separator parts 62a and the peeling tape 71 be "F4".

$$F1, F4 > F3 \quad \text{(Expression 4)}$$

Note that a magnitude relation between F1 and F4 does not matter.

(2-2) When Resin Material Outside Predetermined Areas Remains

After peeling the sheet material 61 attached to the first base material 52, in order to remove the separator parts 62a of the sheet material parts 61a inside the predetermined areas and the resin material part 63b outside the predetermined areas with the use of the peeling tape 71 while leaving the resin material parts 63a inside the predetermined areas of the sheet material 61 defined by the slits 66 on the first base material 52, it is necessary to closely attach the resin material part 63b outside the predetermined areas to the peeling tape 71 by pressing the peeling tape 71 against the first base material 52 with the use of a pressure roller, etc. In this case, the sheet material 61, the first base material 52 and the peeling tape 71 need to satisfy the following relation.

First, in FIG. 11B, in order that the sheet material 61 (separator part 62b) is peeled off from the first base material 52 such that the resin material parts 63a inside the predetermined areas defined by the slits 66 and the resin material part 63b outside the predetermined areas remain on the first base material 52, letting an adhesive force between the resin material 63 and the CF substrates 51 formed on the first base material 52 be "F1", letting an adhesive force between the resin material 63 and an area of the first base material 52 on which the CF substrates 51 are not formed be "F2", and letting an adhesive force between the resin material 63 and the separator 62 be "F3", the following relation holds among these adhesive forces.

$$F1 > F2 > F3 \quad \text{(Expression 5)}$$

Figure 13A:
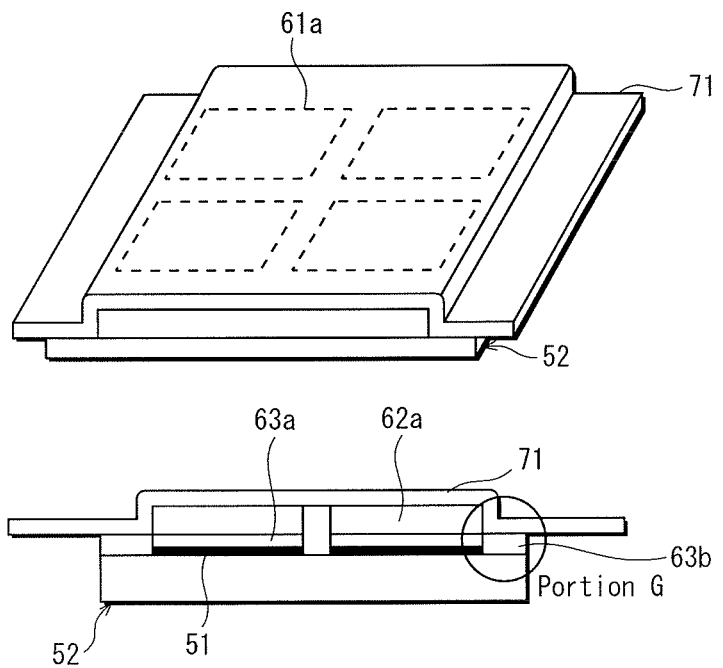
FIGS. 13A and 13B are for explaining characteristics of a sheet material.
Figure 13B:
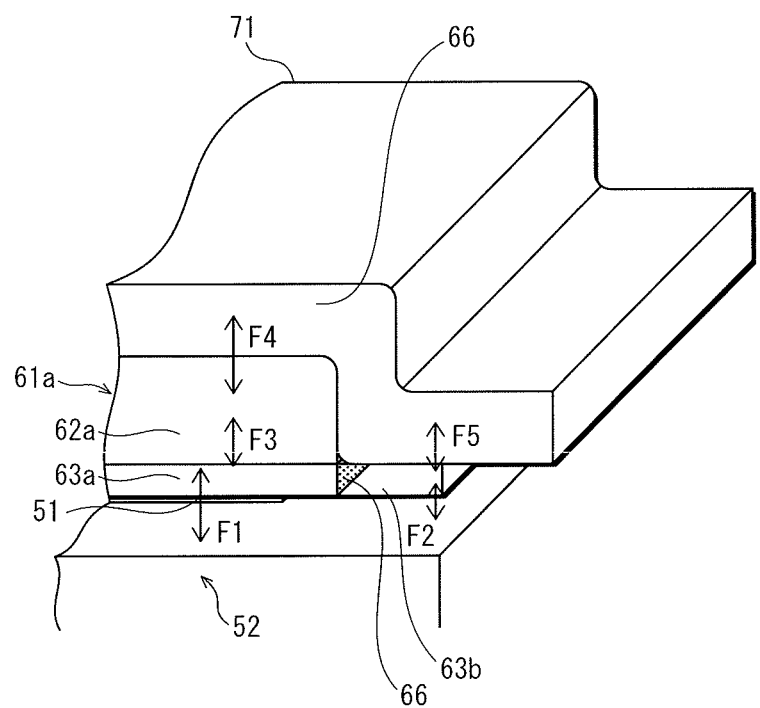

FIGS. 13A and 13B are for explaining characteristics of a sheet material. FIG. 13A is an outline view showing the sheet material having slits, and FIG. 13B is a magnified perspective view of portion G in FIG. 13A.

In order that the resin material parts 63a are not peeled off and only the separator 62 is peeled off by the peeling tape 71 in the predetermined areas, the sheet material 61 and the peeling tape 71 need to satisfy the following relation, letting an adhesive force between the separator 62 and the peeling tape 71 be "F4".

$$F1, F4 > F3 \quad \text{(Expression 6)}$$

Note that a magnitude relation between F1 and F4 does not matter.

Further, in order that the resin material part 63b outside the predetermined areas is peeled off by the peeling tape 71, the resin material 63 and the peeling tape 71 need to satisfy the following relation, letting an adhesive force between the resin material 63 and the peeling tape 71 be "F5".

$$F5 > F2 \quad \text{(Expression 7)}$$

3. Laser Beam

As a laser beam, various beams may be used such as a solid laser beam (e.g., a YAG laser beam, an Nd:YAG laser beam, and an Nd:YVO$_4$ laser beam), a gas laser beam (e.g., a CO$_2$ laser beam, an He—Ne laser beam, an excimer laser beam, an argon laser beam), and a liquid laser beam (e.g., Dye laser beam).

Depending on the material of the first base material 52, it may not be possible to use the above laser beam. That is, those laser beams at some wavelengths penetrate through the sheet material 61, and cannot cut the sheet material 61.

Therefore, it is preferable that a laser beam at a wavelength that is (likely to be) absorbed by the sheet material 61 be used, and that the laser beam have a power to cause material of each of the separators 62 and 64 and the resin material 63 constituting the sheet material 61 to disperse heat, evaporate or sublime over the entire thickness direction thereof.

In Embodiment 2, in the case where a PET film and an epoxy resin are respectively used as the separators 62 and 64 and the resin material 63 of the sheet material 61, a laser beam at a wavelength equal to or shorter than 400 nm (e.g., a UV laser beam) or a CO$_2$ laser beam whose wavelength peak is 10.6 μm may be used.

4. Other

In the above manufacturing method, the sheet material part 61b outside the predetermined areas is peeled off after the slits 66 are formed, and subsequently, the peeling tape 71 is applied to the sheet material parts 61a attached to the predetermined areas, and the separator parts 62a of the sheet material parts 61a are peeled off from the sheet material parts 61a.

However, the peeling tape 71 may be attached after the slits 66 are formed.

That is, the separator parts 62a of the sheet material parts 61a that are attached to the predetermined areas and the sheet material part 61b outside the predetermined areas may be peeled off at the same time by attaching the peeling tape 71 to the entire area of the sheet material 61 or the predetermined areas after the slits 66 are formed, and peeling off the peeling tape 71. This method can be used when Expression 3 is satisfied, like the above-described section (2-1).

[Embodiment 3]

In Embodiment 1, a utility blade is used to cut the sheet material 61 to form the perforations 65. At this point, the utility blade might damage the first base material 52 or the CF substrates 51. If the first base material 52 or the CF substrates 51 are damaged, a crack might occur in the first base material 52 or the CF substrates 51 when the first base material 52 and the second base material 54 are united under a vacuum (see FIG. 8F, FIG. 10H).

The following describes Embodiment 3. According to this, it is possible to prevent the first base material 52 from being damaged when a utility blade is used to form the perforations 65 as the slits. The case in which a laser beam is used to form the slits 66, as described in Embodiment 2, is described in Embodiment 4.

1. Manufacturing Method

The display panel pertaining to Embodiment 3 includes the first substrate 201 (first base material 202) and the second substrate 53 (second base material 54) that is attached to the first substrate 201 by using the resin material 63. The first base material 202 has protection films 205 at areas in which a utility blade is inserted to form the perforations.

FIGS. 14A-14G illustrate a method of manufacturing the display panel of Embodiment 3.

Note that a description of the same step or approximately the same step as that of the method of manufacturing the display panel 10 pertaining to Embodiment 1 is omitted.

The manufacturing method of the display panel includes the following steps.

Figure 14A:
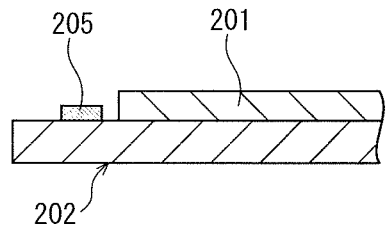
FIGS. 14A-14G illustrate a method of manufacturing a display panel of Embodiment 3.
Figure 14B:
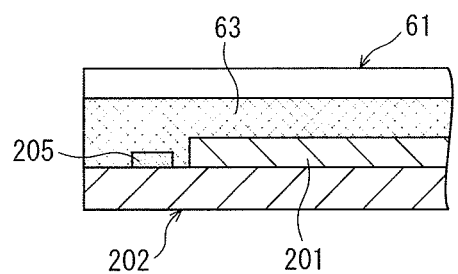

(3a) Preparing the first base material 202 having the CF substrates 201 as the first substrates, as shown in FIG. 14A. As described above, the protection films 205 are formed at portions of the first base material 202 to which a utility blade is to be inserted.

The protection films 205 need to have a certain degree of thickness (that is equal to or greater than a thickness that prevents the utility blade from reaching the first base material 202, taking processing accuracy of the utility blade into consideration) so as to prevent the inserted utility blade from penetrating the protection films 205 and damaging the first base material 202.

Figure 14C:
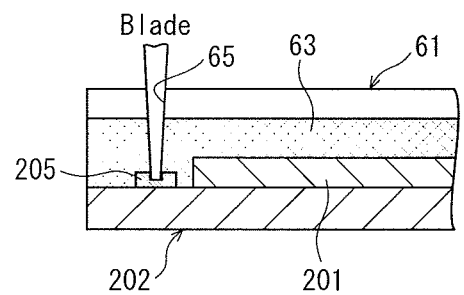

(3b)-(3d) Preparing the sheet material 61 and attaching the sheet material 61 to the first base material 202 (FIG. 14B), and forming the perforations 65 by inserting the utility blade along a predetermined area (FIG. 14C). Note that the steps (3b)-(3d) are basically the same as the steps (b)-(d) in Embodiment 1.

At this point, even when the resin material 63 is completely cut over an entire thickness direction thereof in order to reliably form the perforations 65 in the sheet material 61, the first base material 202 is not damaged due to the protection films 205 provided between the resin material 63 and the first base material 202.

Figure 14D:
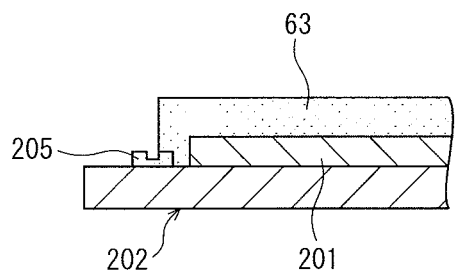
Figure 14E:
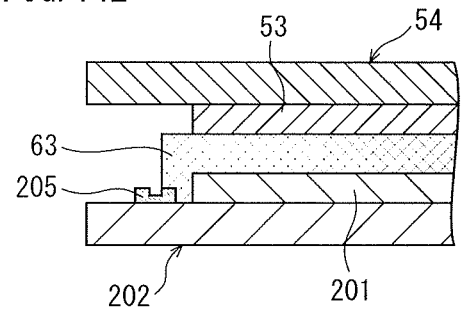
Figure 14F:
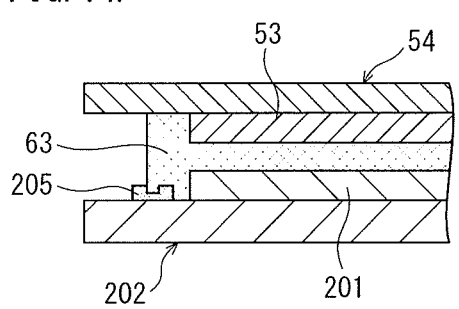

(3e)-(3g) Peeling off the sheet material 61 having the perforations 65 from the first base material 202 except for parts of the resin material 63 inside the predetermined areas (as shown in FIG. 14D), uniting the second base material 54 to the first base material 202 (as shown in FIG. 14E), and curing the resin material 63 (FIG. 14F). Note that the steps (3e)-(3i) are basically the same as the step (e)-(g) in Embodiment 1.

Figure 14G:
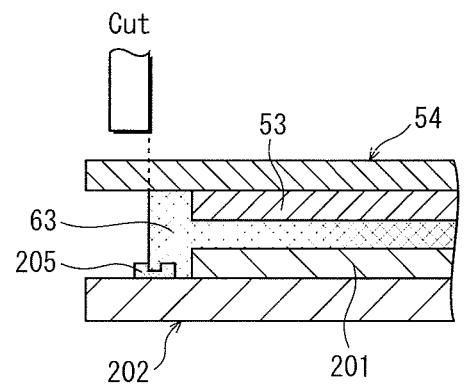

(3h) Dividing the joined EL substrates 11 and the CF substrates 12 from the joined first base material 202 and the second base material 54 into individual substrates, after curing the resin material 63 (FIG. 14G). The display panel 10 is thus obtained.

2. Protection Films

The protection films 205 may be formed of metal material, resin material, rubber material, etc.

In the case of the metal material, a metal film can be formed by the deposition method, for example. In the case of the rubber material, a thin disc-shaped rubber plate may be attached to the first base material 202, for example (note that the concept of film of the present invention permits such rubber plate). In the case of the resin material, a film can be formed by coating, with resin material, a portion to which the utility blade is to be inserted and curing the resin material after the first substrates (CF substrates 201) are formed on the first base material 202, for example.

In particular, if some film (layer) constituting the first substrate 201 functions as the protection films 205, the protection films 205 can be formed in the step of the above step (3a) at the same time as when such a film (layer) is formed. In this case, the protection films 205 can be easily and inexpensively formed compared to when the protection films 205 are separately formed.

For example, when the first substrates 201 (first base material 202) are the CF substrates 12, BMs ("123" in FIG. 1) can be used as the protection films 205. In this case, the BMs 123 functioning as the protection films 205 can be easily provided by changing a mask pattern when the BMs 123 are formed.

3. Cutting

In the above step (3h), as shown in FIG. 14G, the joined EL substrates 11 and the CF substrates 12 are cut out along the side surface of the cured resin material 63, and the display panel having flush side surfaces can be provided, for example.

Otherwise, the protection films 205 may be more externally arranged than the predetermined areas (i.e., the protection films may correspond to provisional areas that are greater than the predetermined areas), and after the first base material 202 and the second base material 54 are joined to each other by using the resin material 63, the joined first base material 202 and second base material 54 may be cut out such that the protection films 205 are not exposed along the side surfaces of the display panel (i.e., the joined first base material 202 and second base material 54 may be cut out along the predetermined areas where the protection films are not formed).

[Embodiment 4]

In Embodiment 2, a laser beam is used to form the slits 66. In this case, the laser beam may damage the first base material 52.

The following describes Embodiment 4. According to this, when a laser beam is used to form the slits 66 as described in Embodiment 2, it is possible to prevent the laser beam from damaging the first base material 52.

While a utility blade is used to cut the sheet material 61 in Embodiment 3, a laser beam is used to cut the sheet material and BMs are used as the protection films in Embodiment 4. In Embodiment 3, the first base material 202, the cured resin material 63 and the second base material 54 are cut out such that the side surfaces of the display panel are to be flush. However, it is unnecessary to cut out the first base material 202 and the second base material 54 such that the side surfaces of the display panel are to be flush, and according the manufacturing method pertaining to Embodiment 4, the side surfaces are not flush after the first base material 202 and the second base material 54 are cut out. Note that the manufacturing method pertaining to Embodiment 4 may be applied to Embodiments 1 through 3.

1. Manufacturing Method

FIGS. 15A-15F illustrate a method of manufacturing the display panel of Embodiment 4, as follows.

Figure 15A:
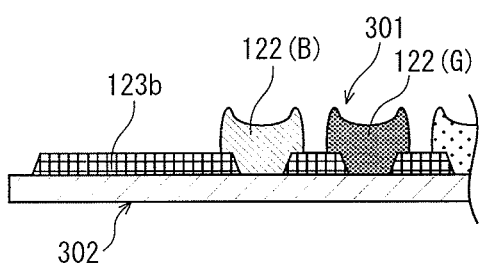
FIGS. 15A-15F illustrate a method of manufacturing a display panel of Embodiment 4.
Figure 15B:
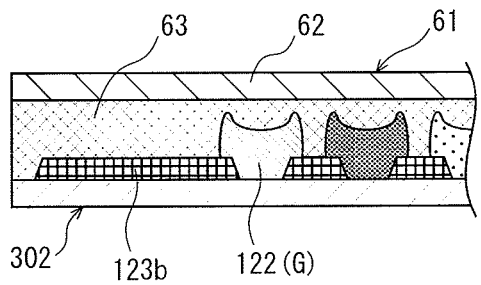

(4a) Preparing the first base material 302 on which the CF substrates 301 functioning as the first substrates are formed, as shown in FIG. 15A. As described above, a BM 123b as a protection film is provided at a portion of the first base material 302 toward which a laser beam is emitted. The BM 123b mentioned here is formed to be greater than the BMs 123 described in Embodiment 1 so as to cover the portion toward which the laser beam is emitted, and formed at the same time as when other BMs 123 are formed.

Figure 15C:
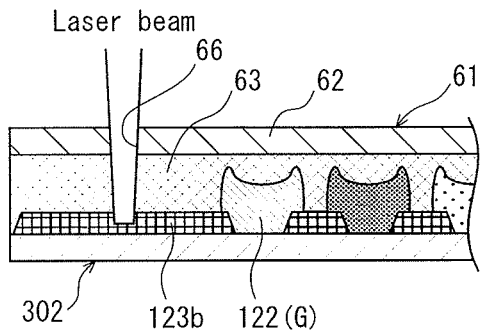

(4b)-(4d) Preparing the sheet material 61 and attaching the sheet material 61 to the first base material 302 (FIG. 15B), and forming the perforations 65 by emitting the laser beam along the predetermined areas (FIG. 15C). Note that the steps (4b)-(4d) are basically the same as the step (2b)-(2d) in Embodiment 2.

At this point, even when the resin material 63 is completely cut over an entire thickness direction thereof in order to reliably form the slits 66 in the sheet material 61, the first base material 302 is not damaged due to the BM (protection film) 123b provided between the resin material 63 and the first base material 302.

Figure 15D:
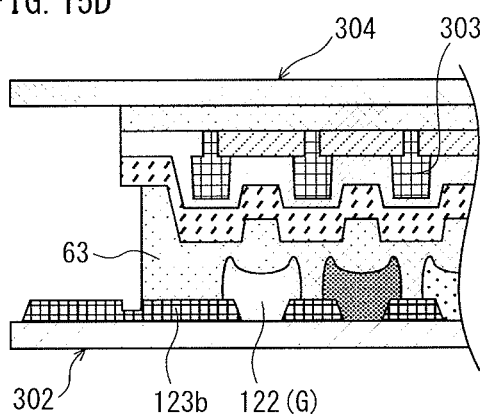

(4e)-(4i) Peeling off the sheet material 61 having the slits 66 from the first base material 302 except for resin material parts 63a inside the predetermined areas, uniting the second base material 304 having the EL substrates 303 as the second substrates to the first base material 302, and curing the resin material 63 (FIG. 15D). Note that the steps (4e)-(4i) are basically the same as the step (2e)-(2g) in Embodiment 2.

Figure 15E:
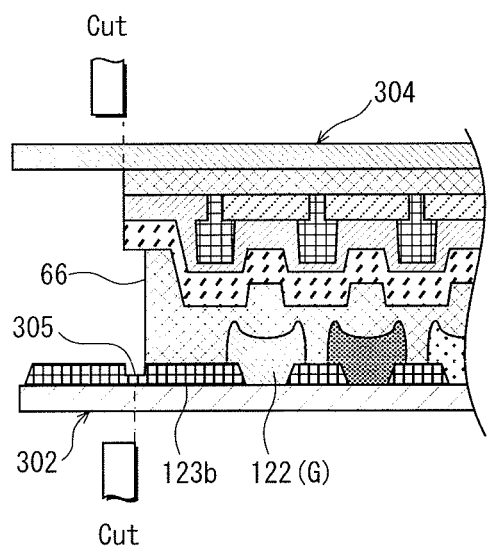

(4j) Cutting out each of the first base material 302 and the second base material 304, after the resin material 63 is cured (FIG. 15E). The first base material 302 is cut out at a position located on the bottom of a groove 305 (shown as dashed line in FIG. 15E). The groove 305 is formed in the BM 123b when the slits 66 are formed in the sheet material 61. The second base material 304 is cut out at a portion that is more externally positioned than the portion at which the first base material 302 is cut.

Figure 15F:
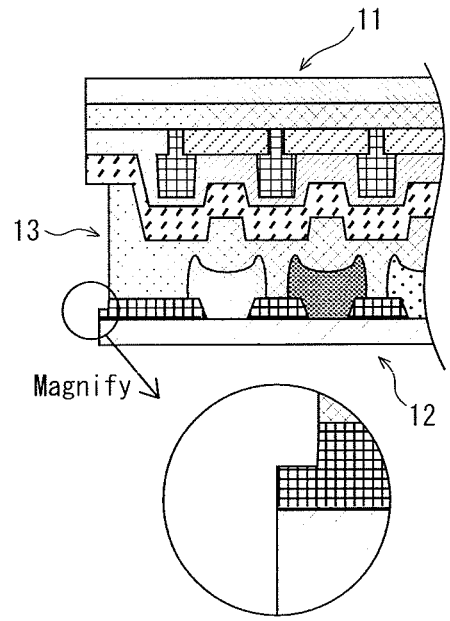

By cutting out the first base material 302 and the second base material 304 as above, the groove 305 formed in the BM 123b is unlikely to be noticed, as shown in FIG. 15F. In addition, by using a resin material with less resin flow during curing, cutting of the resin material 63 can be omitted.

2. Protection Films

Material used as the protection films can be roughly classified into material that reflects the laser beam and material that absorbs the laser beam.

(1) Material Reflecting Laser Beam

The material reflecting the laser beam is metal, for example. In particular, the metal includes nonoxides (nonoxide film) such as aluminum and copper, gold, silver (nonoxide has reflectivity greater than that of oxide), tungsten, etc. When the above materials are used, the protection films are formed by the deposition method.

(2) Material Absorbing Laser Beam

The material absorbing the laser beam includes nonmetal, material that contains carbon, resin, rubber, etc., and some of them may be mixed.

3. Laser Beam

The kinds, power, etc., of the laser beam are as described above in the section 3. Laser beam in Embodiment 2.

[Embodiment 5]

Aside from the manufacturing methods and display panels pertaining to Embodiment 1, Embodiment 2, Embodiment 3 and Embodiment 4 (hereinafter, simply referred to as Embodiments 1-4), only the following structure (technology) may be used, and the following structure may be added to the Embodiments 1-4.

1. Slit for Ease of Separation

The resin material parts 63a inside the predetermined area defined by the slits for ease of separation need to remain on the first base material 52. In contrast, the resin material part 63b outside the predetermined area needs to be peeled off from the first base material 52 along with the sheet material 61 and the peeling tape 71.

However, the resin material parts 63a inside the predetermined area might attach to the separator 62 and be peeled off with the sheet material 61. Such a problem occurs not only on the display panels described in Embodiments 1-4, but also on a joined body manufactured through the step in which a sheet material is attached to a substrate and the sheet material is peeled off such that only resin inside a predetermined area remains.

The following describes the slits for ease of separation at which the resin material 63 of the sheet material 61 can be smoothly attached.

(1) Direction in which Slits for Ease of Separation are Formed

Figure 16A:
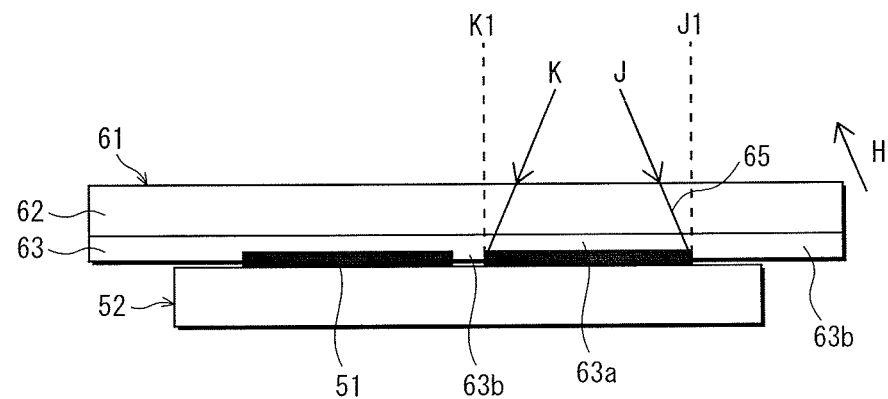
FIGS. 16A and 16B schematically show a direction in which a slit for ease of separation (perforations) is formed, and a separator being peeled off.
Figure 16B:
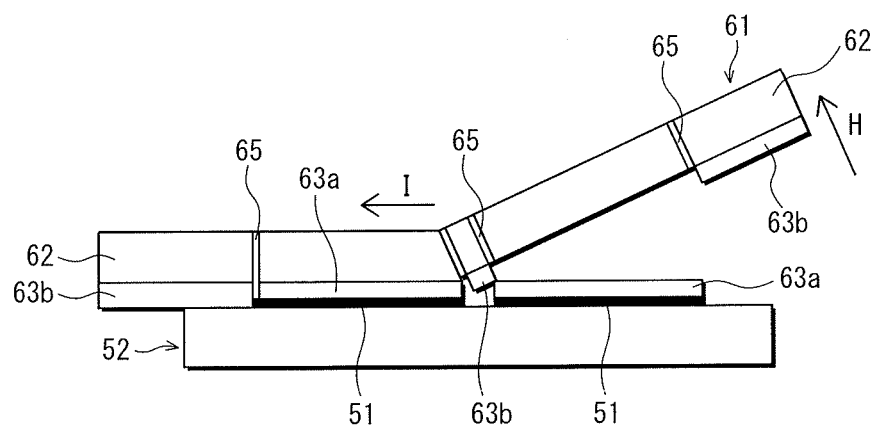

FIGS. 16A and 16B schematically show a direction in which slits for ease of separation (perforations) are formed, and a separator being peeled off. FIG. 16A is for explaining the direction in which the perforations are formed, and FIG. 16B shows a resin material attached to the separator when the separator is peeled off.

FIGS. 16A and 16B show the intermittent perforations 65 that extend in an orthogonal direction to the surface paper on which the drawings are drawn, and are orthogonal to a direction in which the sheet material 61 is peeled off. As shown in FIG. 16A, the sheet material 61 attached to the first base material 52 is lifted up in an H direction from the right side, and peeled off in an I direction as shown in FIG. 16B.

In order to leave the resin material parts 63a on the first base material 52, the perforations 65 are formed in a direction of an arrow J in FIG. 16A. In order not to leave the resin material part 63b on the sheet material 61, the perforations 65 are formed in a direction of an arrow K in FIG. 16A.

Here, the directions of the arrows J and K are described with relevance to a direction in which the sheet material 61 is peeled off. The direction of the arrow J is a direction oblique to a direction from the downstream to the upstream of the sheet material 61 that is to be peeled off (i.e., in the I direction in FIG. 16B). The direction of the arrow K is a direction oblique to a direction from the upstream to the downstream of the sheet material 61 that is to be peeled off.

In other words, with respect to an imaginary line J1 orthogonal to the upper surface of the first base material 52, the direction of the arrow J is a direction from a position on the sheet material 61 that is peeled off later (downstream position in the direction in which the sheet material is peeled off) to the intersection of the upper surface of the first base material 52 and the imaginary line J1.

Similarly, with respect to an imaginary line K1 orthogonal to the upper surface of the first base material 52, the direction of the arrow K is a direction from a position on the sheet material 61 that is peeled off earlier (upstream position in the direction in which the sheet material is peeled off) to the intersection of the upper surface of the first base material 52 and the imaginary line K1.

That is, the direction of the arrow J is a direction inclined from the inside of one predetermined area to the outside of the one predetermined area, as a distance from the first base material 52 increases. Similarly, the direction of the arrow K is a direction inclined from the inside of one predetermined area to the outside of the one predetermined area, as a distance from the first base material 52 increases.

As shown in FIG. 16B, when the perforations 65 are formed in the direction of the arrow J, the resin material parts 63a remain on the first base material 52, and when the perforations 65 are formed in the direction of the arrow K, the resin material part 63b remains on the sheet material 61.

FIGS. 17A and 17B are for explaining a direction of perforations, and a point on which a power to peel off resin material acts. FIG. 17A shows the case when perforations are formed in the direction of the arrow J, and FIG. 17B shows the case when perforations are formed in the direction of the arrow K.

The direction of the arrow J in FIG. 17A is for leaving the resin material parts 63a, and the direction of the arrow K in FIG. 17B is for peeling off the resin material part 63b.

First, as shown in FIG. 17A, in the case when a perforation 65 is formed in the direction of the arrow J, the sheet material 61 is lifted up in the H direction and starts to be peeled off ((1) in FIG. 17A). Next, a force to peel off the sheet material 61 acts at the upper edge of a resin material part 63a facing the perforation 65 (that is close to the separator 62, a black circle in (2) in FIG. 17A). Eventually, the resin material part 63a are separated from the separator 62 ((3) in FIG. 17A).

Next, as shown in FIG. 17B, in the case when a perforation 65 is formed in the direction of the arrow K, the sheet material 61 is lifted up in the H direction and starts to be peeled off ((1) in FIG. 17B). Next, a force to peel off the sheet material 61 acts at the upper edge of the resin material part 63b facing the perforation 65 (in contact with the separator 62, a black circle in (2) in FIG. 17B). At this point, the edge of the resin material part 63b is thin, and therefore, the resin material part 63b is deformed along with the peeled separator 62 and is not peeled off.

As the sheet material 61 is further peeled off, a point of the force to peel off the sheet material 61 (black circle) moves to the lower edge of the resin material 63 facing the perforation 65 (in contact with first base material 52), and acts between the resin material part 63a and the first base material 52 ((3) in FIG. 17B). Then the resin material part 63a is separated from the first base material 52 ((4) in FIG. 17B).

Note that in Embodiments 1 and 3, the perforations 65 are formed by using the utility blade, and in these cases, a direction in which the perforations 65 are formed can be varied by tilting the utility blade. When the laser beam is used to form the perforations 65 as described in Embodiments 2 and 4, the direction can be similarly varied by inclining the emitting direction of the laser beam.

(2) Peeling Agent

Figure 18A:
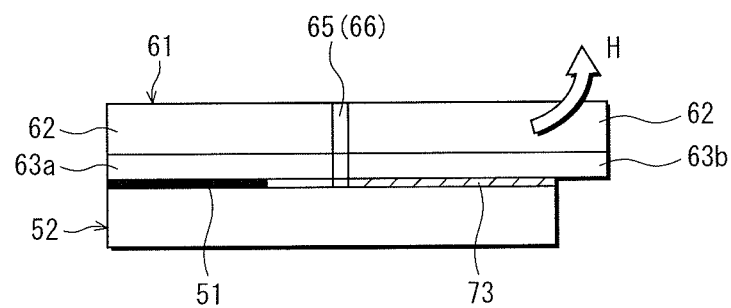
FIGS. 18A and 18B are schematically show the case when peeling treatment is applied to the first base material.
Figure 18B:
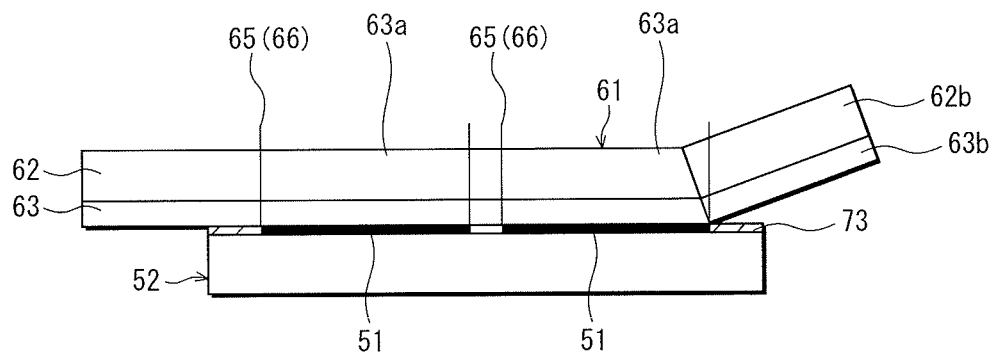

FIGS. 18A and 18B are schematically show the case when peeling treatment is applied to the first base material. FIG. 18A is for explaining an area to which the peeling treatment is applied, and FIG. 18B shows a resin material attached to the separator when the separator is peeled.

Areas of the first base material 52 which correspond to the predetermined areas, to which the resin material parts 63a are to be attached, have been cleaned for degreasing, etc. In contrast, peeling treatment has been applied to an area of the first base material 52 from which the resin material part 63b is to be peeled off along with the separator 62 when the sheet material 61 is peeled off.

The peeling treatment is for making the adhesive force F2 between the resin material part 63b and the upper surface of the first base material 52 (see FIG. 9B) smaller than the adhesive force F3 between the resin material 63 and the separator 62 (see FIG. 9B). This treatment makes Expression 1 always hold.

For example, the peeling treatment can be applied by coating, with a peeling agent (such as silicone resin and fluorine resin), the area of the first base material 52 from which the resin material part 63b is to be peeled off along with the separator 62 (a peeling film 73 is formed).

The sheet material 61 from which the lower separator 64 has been peeled off is attached to the first base material 52 after the above-mentioned peeling treatment (i.e., after forming the peeling film 73), and subsequently the perforations 65 or the slits 66 are formed as shown in FIG. 18A.

When the sheet material 61 is peeled off from the first base material 52, portion of the sheet material 61 close to the periphery of the first base material 52 is lifted up in an H direction in FIG. 18A (above the first base material 52) away from the first base material 52.

In this case, the peeling film 73 has been formed on part of the upper surface of the first base material 52 from which the resin material part 63b is to be peeled off. Therefore, as shown in FIG. 18B, the resin material part 63b in contact with the peeling film 73 is peeled off from the first base material 52 along with the separator 62.

If the resin material part 63b is once attached to the separator part 62b and started to be peeled off from the first base material 52, and if the resin material part 63b has mechanical characteristics to remain attached to the separator 62 and to be peeled off from the first base material 52, i.e., the strength not to be torn off during being peeled off, the peeling treatment has only to be applied at least to a specific part of the first base material 52 from which the sheet material 61 is started to be peeled off.

The following specifically describes an effect of the peeling film when the perforations 65 or the slits 66 are formed.

(2-1) Intermittent Slits (Perforations)

FIGS. 19A-19E show the relationship among adhesive forces that vary in accordance with whether or not a peeling film is provided at perforations.

(a) without Peeling Film

Figure 19A:
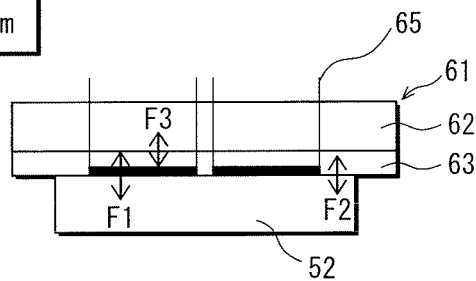
FIGS. 19A-19E show the relationship among adhesive forces that vary in accordance with whether or not a peeling film is provided at perforations.

As shown in FIG. 19A, letting an adhesive force between the resin material parts 63a inside the predetermined areas and the upper surface of the first base material 52 be F1, letting an adhesive force between the resin material part 63b outside the predetermined areas and the upper surface of the first base material 52 (without peeling film) be F2, and letting an adhesive force between the separator 62 and the resin material parts 63a and 63b be F3.

Figure 19B:
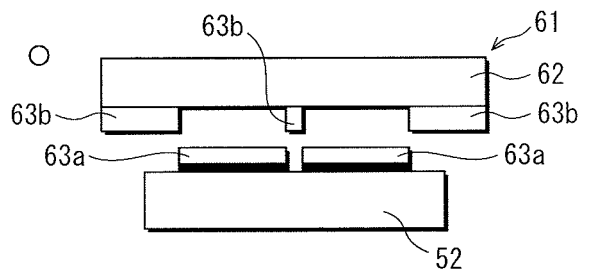

As shown in FIG. 19B, only the resin material parts 63a inside the predetermined areas remain on the first base material 52 when the above three adhesive forces F1, F2 and F3 satisfy the following relation.

$$F1 > F3 > F2 \qquad \text{(Expression 8)}$$

Figure 19C:
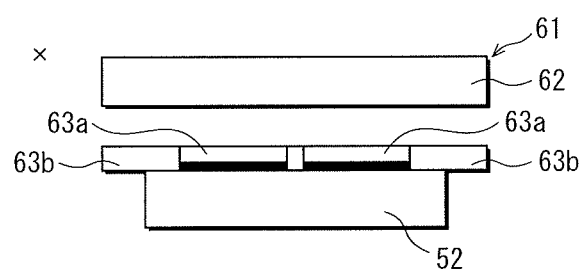

In contrast, as shown in FIG. 19C, the resin material part 63b outside the predetermined areas also remains on the first base material 52 when the above three adhesive forces F1, F2 and F3 satisfy the following relation.

$$F1, F2 > F3 \qquad \text{(Expression 9)}$$

(b) With Peeling Film

Figure 19D:
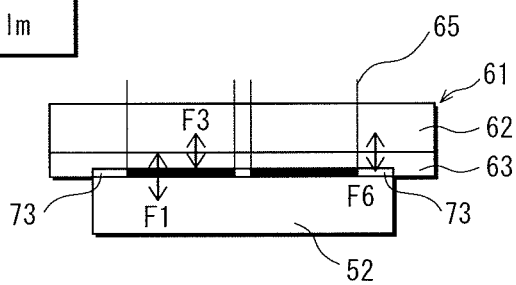

As shown in FIG. 19D, letting an adhesive force between the resin material parts 63a inside the predetermined areas and the upper surface of the first base material 52 be F1, letting an adhesive force between the resin material part 63b outside the predetermined areas and the peeling film 73 be F6, and letting the adhesive force between the separator 62 and the resin material parts 63a and 63b be F3.

Figure 19E:
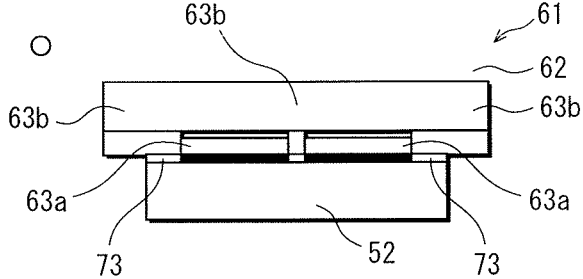

As shown in FIG. 19E, only the resin material parts 63a inside the predetermined areas remain on the first base material 52 when the above three adhesive forces F1, F3 and F6 satisfy the following relation.

$$F1 > F3 > F6 \qquad \text{(Expression 10)}$$

(c) Summary

As described in the above sections (a) and (b), if the peeling film 73 is not provided, only when Expression 8 is satisfied, the resin material parts 63a inside the predetermined areas remain on the first base material 52.

However, even when the adhesive force F2 between the resin material part 63b and the first base material 52 is greater than the adhesive force F3 between the resin material part 63b and the separator 62 (when Expression 9 is satisfied), providing the peeling film 73 enables the adhesive force between the upper surface of the first base material 52 and the peeling film 73 to be F6, and it is possible to easily leave only the resin material parts 63a inside the predetermined areas on the first base material 52.

(2-2) Continuous Slits

FIGS. 20A-20E show the relationship among adhesive forces that vary in accordance with whether or not a peeling film is provided at continuous slits.

(a) Without Peeling Film

Figure 20A:
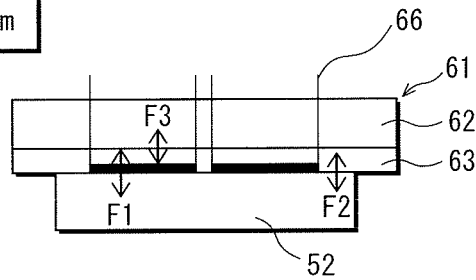
FIGS. 20A-20E show the relationship among adhesive forces that vary in accordance with whether or not a peeling film is provided at continuous slits.

As shown in FIG. 20A, letting an adhesive force between the resin material parts 63a inside the predetermined areas and the upper surface of the first base material 52 be F1, letting an adhesive force between the resin material part 63b outside the predetermined area and the upper surface of the first base material 52 (without peeling film) be F2, and letting an adhesive force between the separator 62 and the resin material parts 63a and 63b be F3.

Figure 20B:
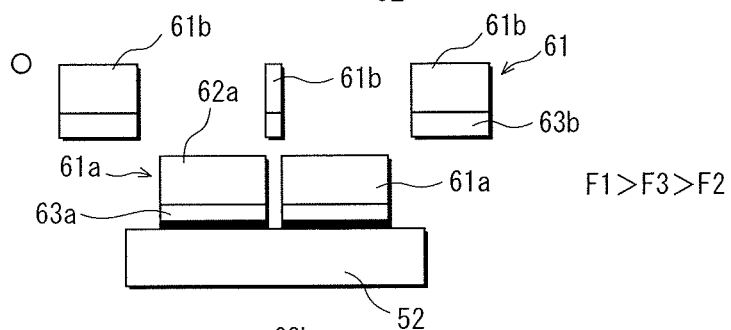

As shown in FIG. 20B, only the resin material parts 63a inside the predetermined areas remain on the first base material 52 when the above three adhesive forces F1, F2 and F3 satisfy the following relation.

$$F1 > F3 > F2 \qquad \text{(Expression 11)}$$

Figure 20C:
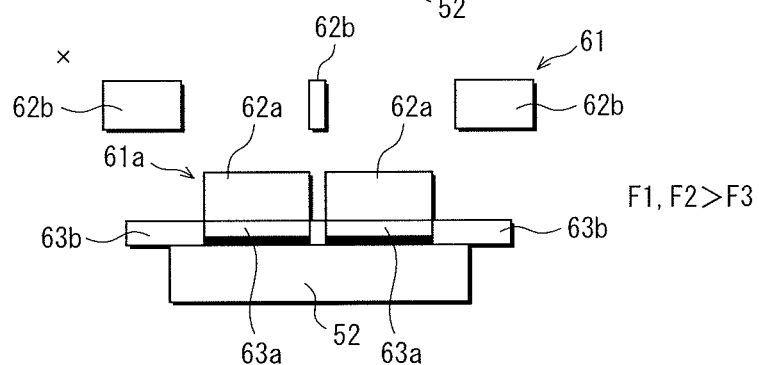

In contrast, as shown in FIG. 20C, not only the sheet material parts 61a inside the predetermined areas but also the resin material part 63b outside the predetermined areas remains on the first base material 52 when the above three adhesive forces F1, F2 and F3 satisfy the following relation.

$$F1, F2 > F3 \qquad \text{(Expression 12)}$$

(b) With Peeling Film

Figure 20D:
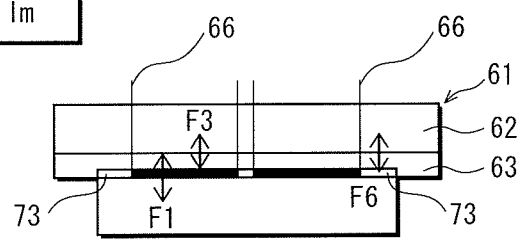

As shown in FIG. 20D, letting an adhesive force between the resin material parts 63a inside the predetermined areas and the upper surface of the first base material 52 be F1, letting an adhesive force between the resin material part 63b outside the predetermined areas and the peeling film 73 be F6, and letting the adhesive force between the separator 62 and the resin material parts 63a and 63b be F3.

Figure 20E:
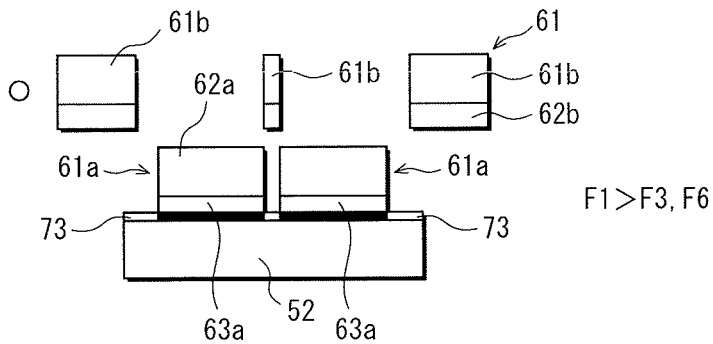

As shown in FIG. 20E, when the above three adhesive forces F1, F3 and F6 satisfy the following relation, only the sheet material parts 61a inside the predetermined areas remain on the first base material 52, and the sheet material part 61b outside the predetermined areas is peeled off from the first base material 52.

$$F1 > F3 > F6 \qquad \text{(Expression 13)}$$

(c) Summary

As described in the above sections (a) and (b), if the peeling film 73 is not provided, the sheet material parts 61a inside the predetermined areas remain on the first base material 52 only when Expression 11 is satisfied.

However, even when the adhesive force F2 between the resin material part 63b and the first base material 52 is greater than the adhesive force F3 between the resin material part 63b and the separator 62 (when Expression 12 is satisfied), providing the peeling film 73 enables the adhesive force between the upper surface of the first base material 52 and the peeling film 73 to be F6, and it is possible to easily leave only the sheet material parts 61a inside the predetermined areas on the first base material 52.

(3) Curing

Figure 21A:
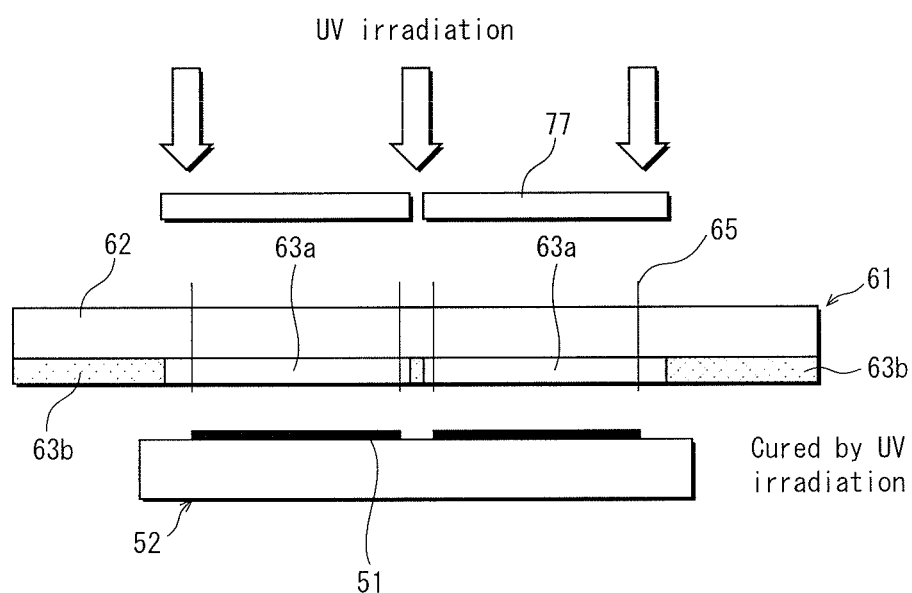
FIGS. 21A and 21B are schematically show the case when part of resin material is cured.
Figure 21B:
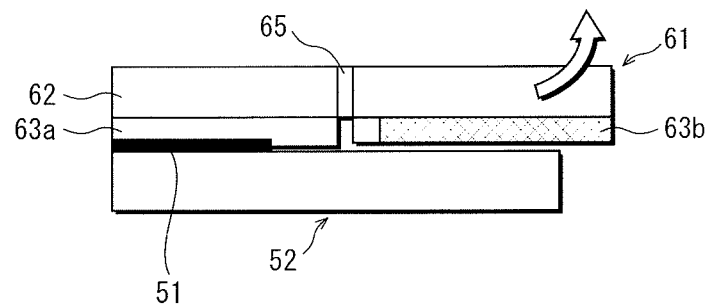

FIGS. 21A and 21B are schematically show the case when part of a resin material is cured. FIG. 21A is for explaining a method for curing the part, and FIG. 21B shows a resin material attached to the separator when the separator is peeled off.

On the sheet material 61 pertaining to the present example, the resin material part 63b outside the predetermined areas that is to be attached to the first base material 52 is cured. If the resin material 63 is formed of resin that is cured by UV irradiation, e.g., photocurable acrylic material, as shown in FIG. 21A, in order to cure part (63b) of the resin material 63, a mask 77 is used for irradiating only the part (63b) that is to be cured with UV, and the sheet material 61 is irradiated with UV for a certain time period.

Due to this, the part (63b) of the resin material 63 is cured, and the cured resin material part 63b is not joined (or is unlikely to be joined) to the first base material 52. Therefore, an adhesive force therebetween is smaller than the adhesive force between the resin material 63 and the separator 62.

After the sheet material 61 having the part (63b) of the resin material 63 that is thus cured is attached to the first base material 52, the perforations 65 or the slits 66 are formed.

When the sheet material 61 is peeled off from the first base material 52, as shown in FIG. 21B, portion of the sheet material 61 close to the periphery (here, on the right) of the first base material 52 is lifted up in a direction of the arrow in FIG. 21B away from the first base material 52.

At this point, the resin material part 63b that corresponds to the part of the upper surface of the first base material 52 and that is to be peeled off from the first base material 52 has been cured. Therefore, an adhesive force between the resin material part 63b and the first base material 52 is small as shown in FIG. 21B, and the resin material part 63b is peeled off from the first base material 52 along with the separator 62.

If the resin material 63 is once attached to the separator 62 and started to be peeled off from the first base material 52, and if the resin material 63 has mechanical characteristics to remain attached to the separator 62 and to be peeled off from the first base material 52, i.e., the strength not to be torn off during being peeled off, the curing treatment has only to be applied at least to a specific part of the first base material 52 from which the sheet material 61 is started to be peeled off.

The resin material part 63b is not necessarily to be completely cured. The resin material part 63b may be semi-cured (in a state before completely cured), and it suffices if an adhesive force between the first base material 52 and the resin material part 63b that is in process of curing becomes smaller than the adhesive force between the resin material 63 and the separator 62.

(4) Combination

As the technology for smoothly separating the resin material parts 63a from the sheet material 61, the direction in which the slits for ease of separation are formed, the peeling treatment applied to the first base material 52, and the curing processing applied to the resin material 63 have been described.

One of these technologies may be applied to Embodiments 1-4, a combination of two of these technologies may be applied to Embodiments 1-4, and a combination of all of these technologies may be applied to Embodiments 1-4.

(5) Other

In Embodiment 5, the technology of leaving, on the first base material 52, the resin material parts 63a inside the predetermined areas defined by the slits for ease of separation has been described. This technology can be implemented regardless of a tool that forms the slits, such as a utility blade, laser beam, and punching.

<Modifications>

1. Manufacturing Method (1) The display panel 10 pertaining to Embodiment 1, etc., is manufactured by a step of preparing the EL substrate 11, a step of preparing the CF substrate 12, and a step of uniting the prepared EL substrate 11 and the prepared CF substrate 12.

However, after part of the resin material of the sheet material is attached to the first base material, to which the resin material is to be attached, the second base material may be prepared, and subsequently the first base material and the second base material may be united to each other.

That is, the display panel may be manufactured as follows: the resin material of the sheet material is attached to the predetermined areas of the first base material, and subsequently the first base material and the second base material are united to each other. It suffices if the second base material has been prepared when the second base material is united to the first base material.

To be specific, the second base material may be prepared at the following point in time: before the sheet material is attached to the first base material; after the sheet material (the separator and the resin material) is attached to the first base material (before the separator is peeled off); after the first base material and the second base material are prepared to be united to each other (the resin material is attached only to the predetermined areas of the first base material); when the first base material is prepared; or before the first base material is prepared.

(2) In the step (a) in Embodiment 1, etc., the first base material 52 is subject to UV ozone cleaning. However, other methods may be used to clean the substrate. Furthermore, a substrate that has been cleaned may be prepared.

The first base material (substrate 52) has the plurality of first substrates (CF substrates 12) 51 formed thereon. However, the first base material may have one first substrate formed thereon. That is, the first base material may be the first substrate.

(3) In the step (c) in Embodiment 1, etc., the first base material 52 is positioned lower than the sheet material 61, and the sheet material 61 is attached to the upper surface of the first base material 52. However, the sheet material 61 having the resin material 63 on its upper surface may be disposed lower than the first base material 52, and the first base material 52 may be attached to the upper surface of the sheet material 61 (i.e., the upper surface of the resin material 63). Alternatively, the first base material 52 or the sheet material 61 may be turned upside down during the step.

That is, the vertical positional relationship between the sheet material 61 and the first base material 52 in Embodiment 1 may be reversed, and further, the sheet material 61 and the first base material 52 may be attached to each other from left and right.

(4) Although the pattern (shape) of the perforations 65 has not been particularly described in Embodiment 1 or Embodiment 3, it suffices if the resin material parts 63a remain on the predetermined areas of the first base material 52 and the resin material part 63b outside the predetermined areas is peeled off from the first base material 52, when the separator 62 is peeled off.

To be specific, the perforations 65 consist of alternate slits and ties. The slits are formed by severing the sheet material 61, and the ties are formed by not severing the sheet material 61. The lengths of the slits and ties, or the intervals between the slits may be or may not be constant. Further, the perforations may consist of slits each having the constant length and ties each having a different length, or may consist of slits and ties each having a different length.

(5) In the step (g) in Embodiment 1 or in the step (i) in Embodiment 2, the resin material 63 is cured by heat. However, depending on the type of resin material, the resin material may be cured by UV irradiation described in Embodiment 5, for example. If the resin material is cured not only by heat but also by UV, the resin material may be cured by both heating and UV irradiation. Alternatively, heating and UV irradiation may be used in this order, or heating and UV irradiation may be alternately used.

It is natural that when the resin material is cured by other methods, these methods may be used to cure the resin material. These methods may be added to heating, or these methods and heating may be alternately used.

2. Formation of Slits for Ease of Separation
(1) Mark

Although a mark that functions as a guide when the slits for ease of separation are formed has not been particularly described in Embodiment 1 or Embodiment 3, the first base material may be assigned a mark, or a step of assigning a mark to the first base material may be performed before the sheet material is attached to the first base material, in Embodiments 1-4.

Figure 22A:
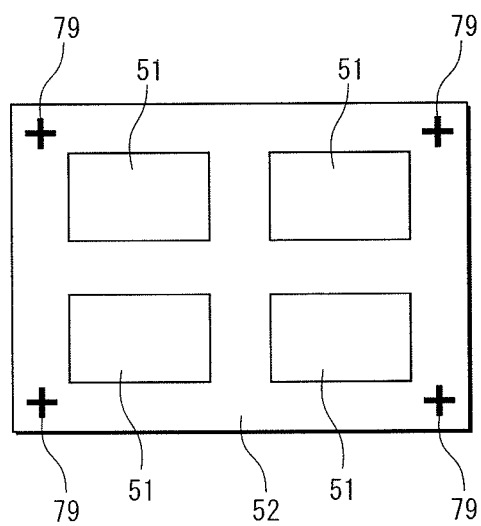
FIGS. 22A and 22B each show the first base material having marks.
Figure 22B:
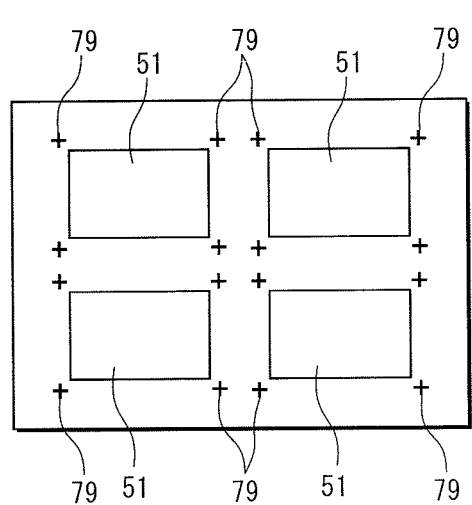

FIGS. 22A and 22B show the first base material having marks.

In FIGS. 22A and 22B, the first base material 52 has the four first substrates 51 formed thereon. However, the number of the first substrates 51 is not particularly limited, and may be one, or more than one. Further, the first substrates 51 may be used for CF substrates (12) or EL substrates (11), for example. Furthermore, in the case of other joined bodies such as a PDP display device, the first substrates may be used as front panels or back panels.

As described in Embodiment 5, this modification can be applied to a step in which the sheet material 61 is attached to the first base material 52, and the sheet material 61 is peeled off such that only the resin material parts 63*a* inside the predetermined areas remain.

As shown in FIG. 22A, it suffices if two or more marks 79 (e.g., four) are assigned to one first base material 52, and the positions of the marks 79 are not particularly limited. In FIG. 22A, the first base material 52 is rectangular as seen in a plan view, and the four marks 79 are respectively provided at the four corners of the first base material 52.

As shown in FIG. 22B, the number of the marks 79 may be two or more (e.g., four) for each first substrate 51 formed on the first base material 52, and the positions of the marks 79 are not particularly limited. In FIG. 22B, each of the first substrates 51 is rectangular as seen in a plan view, and the 16 marks 79 are provided outside all of the corners of the four first substrates 51 of the first base material 52.

Figure 22C:
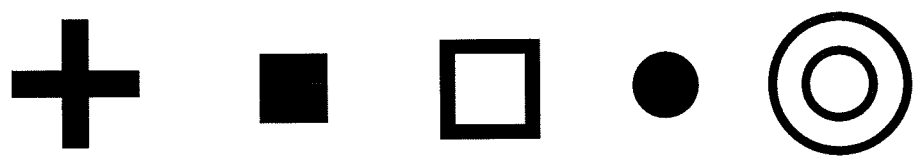
FIG. 22C shows marks.

The shape and size of each mark may be not particularly limited, and it suffices if the mark functions as a guide when the slits for ease of separation are formed. The examples of the mark include, as shown in FIG. 22C, the shape of a cross, a rectangle (including one filled with black color or white color), and a circle (including one filled with black color or white color).

(2) Timing at which Mark is Assigned

As described above, the marks 79 may be formed on the first base material 52, and subsequently, the first substrates 51 may be formed by using the marks 79 as a reference. That is, in Embodiments 1-5, the marks 79 may be formed in the step of preparing the first base material 52.

The marks 79 may be assigned after the first substrates 51 are formed on the first base material 52. That is, in Embodiments 1-5, the marks may be formed after the step of preparing the first base material, or after the step of attaching the sheet material 61 (before forming the slits for ease of separation).

3. Number of First Substrates and Method for Attaching Sheet Material

A method for attaching the first base material and the sheet material has not been particularly described in the above Embodiments. The method for attaching the first base material and the sheet material is not particularly limited. The following describes one example thereof.

FIGS. 23A to 25C show examples of the number of first substrates and a method for attaching the sheet material.

FIGS. 23A and 23B each show an example in which one first substrate is obtained from one base material (single obtaining). FIGS. 24A and 24B each shows an example in which three first substrates are obtained from one base material (triple obtaining). FIGS. 25A-25C each show an example in which four first substrates are obtained from one base material (quadruple obtaining).

FIGS. 23A to 25C show the first base material having the first substrates 51 formed thereon, and the first substrates 51 may be CF substrates 12 or EL substrates 11, for example. Furthermore, in the case of other joined bodies such as a PDP display device, the first substrates may be used as front panels or back panels.

(1) Single Obtaining

In this example, one first substrate 51 is formed on one first base material 401. The sheet material 61 may be applied in the form of a roll, as shown in FIG. 23A. Alternatively, the sheet material 61 may be preliminarily cut in accordance with the size of the first substrate 51 (predetermined area) in the form of a sheet that is greater than the predetermined area, as shown in FIG. 23B.

(2) Triple Obtaining

In this example, three first substrates 51 are formed in a row on one first base material 411. The sheet material 61 may be applied in the form of a roll, as shown in FIG. 24A. Alternatively, the sheet material 61 may be preliminarily cut in accordance with the size of each of the three first substrates 51 (predetermined areas) in the form of a sheet that is greater than the corresponding predetermined area, as shown in FIG. 24B.

(3) Quadruple Obtaining

In this example, four substrates 51 are formed in two rows (two substrates are in each row) on one first base material 421. The sheet material 61 may be applied in the form of a roll, as shown in FIG. 25A. The two sheet materials 61 each in the form of a roll may be used in parallel, as shown in FIG. 25B. Alternatively, the sheet material 61 may be preliminarily cut in accordance with the size of each of the first substrates 51 (predetermined areas) in the form of a sheet that is greater than the corresponding predetermined area, as shown in FIG. 25C.

(4) Size of Sheet Material

The size of the sheet material 61 has not been particularly described in the above sections (1)-(3). The sheet material 61 needs to be greater in area than each of the areas in which the slits for ease of separation are to be formed (predetermined areas in each embodiment). If this condition is satisfied, the sheet material 61 may be greater than the first base material 401 in area as shown in FIG. 23A, or may be smaller than the first base material 401 in area as shown in FIG. 23B.

Here, the expression "greater in area" means that when the sheet material 61 is put on the first base material 52, 401, 411, 421, etc., the predetermined area of the first substrate 51 is completely covered by the sheet material 61, and the expression "smaller in area" means that when the sheet material 61 is put on the first substrate 51, the predetermined area of the first substrate 51 is not covered by the sheet material 61.

Therefore, even when the sheet material 61 is greater in area than the predetermined area of the first substrate 51, if the predetermined area is exposed from the sheet material 61, the expression "greater in area" is not applied to this case. Examples in which the sheet material 61 greater in area cannot cover the predetermined area include a case in which the sheet material (61) is elongated, and the first substrate 51 is a square having a side longer than the width of the sheet material (61).

In the above embodiments, etc., the number of the first substrates formed on the first base material and the number of the second substrates formed on the second base material are the same. However, these two numbers need not to be the same.

For example, suppose that four first substrates are formed on the first substrate. In this case, two second base materials each having two second substrates corresponding to the first substrates of the first base material in arrangement may be used, and the first substrates and the second substrates may be united to each other. Alternatively, four second base materials each having one second substrate (second substrates per se) may be used, and the first substrates and the second substrates may be united to each other.

4. Sheet Material

In the above embodiments, etc., the sheet material 61 is composed of the resin material 63 and the pair of separators 62 and 64 sandwiching the resin material 63. Examples of the separators 62 and 64 include a PET film described in Embodiment 2. However, it is possible to use film (resin) formed of other material, or to use paper material whose surface has been subject to peeling treatment.

Alternatively, it is possible to form the sheet material by providing (coating), with resin material, one of the main surfaces of a separator that have peelability to resin material, and winding the separator into a roll.

In this case, a surface of the resin material that is opposite the separator is in contact with the surface of the separator that is wound into a roll, and air-tightness is retained.

When the sheet material with the above structure is used, the step (b) in Embodiment 1 (FIG. 8B) and the step (2b) in Embodiment 2 (FIG. 10B) in which the one (lower) separator 64 is peeled off from the sheet material are unnecessary.

5. Display Panel

In Embodiment 1, etc., the display panel such as an organic EL display device has been described as an example of a joined body. However, the joined body may be an inorganic EL display device using an inorganic light-emitting layer. Alternatively, other display panels such as a liquid crystal display panel or a PDP may be used.

6. Predetermined Area

In Embodiments 1-5, the shape of each predetermined area to which the resin material is to be attached is rectangular. However, other shapes may be used. Other shapes include an ellipsoid (including circle), and a polygon such as a triangle and a pentagon.

Further, a quadrangular annular shape may be used. Examples of such an annular predetermined area include a circumferential area of the front panel when the joined body is a PDP device.

7. Joined Body

In Embodiments 1-5, the display panel is described as a joined body, and in item (1) of the section of 2. Formation of slits for ease of separation in Modifications, the PDP display device is described as a joined body. Examples in which other joined bodies are formed include the followings: the case where an antireflective film (so-called "AR film") is attached to a screen of a liquid crystal display device, an EL display device, a PDP display device, etc.; the case where a transparent substrate (e.g., ITO substrate, etc.) is attached to an information display screen (e.g., liquid crystal screen) (so-called touch screen); the case where an electromagnetic wave cutting film is attached to a PDP display device; the case where a sealing sheet (e.g., ethylene-vinyl acetate copolymers) is attached to a solar battery element in the field of solar batteries; and the case where a smoke film is attached to a window or a body film is attached to a vehicle in the field of vehicles.

8. Conclusion

In the present description, the manufacturing method of a joined body such as a display panel is described as a main invention. However, a main characteristic of the present description is a step in which a sheet-like resin material is attached only to the predetermined area of the first base material (i.e., a peeling step in which only a resin material part inside the predetermined area is separated from the sheet material).

Therefore, the present description includes a method of attaching the resin material part only to the predetermined area of the first base material.

The present description also includes a method for causing the resin material part inside the predetermined area to easily remain on the first base material when the sheet base material of the sheet material is peeled off (e.g., formation of peeling film), or a method of cutting the sheet material.

INDUSTRIAL APPLICABILITY

The present invention is widely applicable to attaching the sheet-like resin material to the first substrate.

REFERENCE SIGNS LIST

10. Display panel
11 EL substrate
12 CF substrate
13 sealing resin layer
51 first substrate
52 first base material
53 second substrate
54 second base material
61 sheet material
62, 64 separator (sheet base material)
63 resin material
65 perforation (slit for ease of separation)
66 cut (slit for ease of separation)
71 peeling tape
73 peeling film
205 protection film

The invention claimed is:

1. A method for manufacturing a joined body composed of a first base material and a second base material joined together by resin material attached to a predetermined area of the first base material, the method comprising:
    attaching a sheet material to the first base material so as to cover the predetermined area, the sheet material including a sheet base material and the resin material provided on one main surface of the sheet base material;
    forming, after attaching the sheet material to the first base material, a slit for ease of separation in the sheet material in accordance with an outline of the predetermined area; and
    separating, after forming the slit for ease of separation, a part of the resin material inside the slit from the sheet base material such that the part of the resin material inside the slit remains on the predetermined area of the first base material and the rest of the resin material outside the slit does not remain on the first base material.

2. The method of claim 1, wherein
the slit continuously extends along a main surface of the sheet material.

3. The method of claim 2, wherein
the sheet material has a two-layer structure, and the resin material has a smaller tensile strength than the sheet base material.

4. The method of claim 1, wherein
the slit comprises a plurality of intermittent perforations extending along a main surface of the sheet material.

5. The method of claim 1, wherein
the sheet material has a layer structure of at least the sheet base material and the resin material.

6. The method of claim 1, wherein
the slit for ease of separation is formed by cutting the sheet material, and
the method further comprises
forming, before attaching the sheet material to the first base material, a protection film in an area of the first base material that includes a portion corresponding to a portion of the sheet material that is to be cut.

7. The method of claim 6, wherein
the protection film is formed of metal.

8. The method of claim 6, wherein
a laser beam is used to form the slit for ease of separation, and
the protection film is formed of material that reflects or absorbs the laser beam.

9. The method of claim 6, wherein
in forming the slit for ease of separation, a laser beam is used to cut the sheet material.

10. The method of claim 9, wherein
a wavelength of the laser beam is a wavelength at which the resin material and the sheet base material absorb the laser beam, and
a power of the laser beam is a power that causes each of the resin material and the sheet base material to disperse heat, evaporate or sublime over an entire thickness direction of each of the resin material and the sheet base material.

11. The method of claim 9, wherein
the laser beam is an infrared laser beam, and
the infrared laser beam causes each of the resin material and the sheet base material to disperse heat over an entire thickness direction of each of the resin material and the sheet base material.

12. The method of claim 9, wherein
the laser beam is a UV laser beam, and
the UV laser beam causes each of the resin material and the sheet base material to evaporate or sublime over an entire thickness direction of each of the resin material and the sheet base material.

13. The method of claim 6, wherein
in forming the slit for ease of separation, a blade is used to cut the sheet material.

14. The method of claim 6, wherein
the slit for ease of separation is formed in a direction orthogonal to a direction in which the sheet base material is peeled off in plan view, and as a distance between the first base material and a cut section of the slit increases, the cut section is slanted from outside of the predetermined area to inside of the predetermined area.

15. The method of claim 2, wherein
the slit for ease of separation comprises perforations.

16. The method of claim 2, wherein
the first base material includes a substrate used for a display panel, and
the slit for ease of separation is formed in an area of the substrate in which no image is to be displayed.

17. The method of claim 16, wherein
a black matrix is formed at a portion of the substrate corresponding to the area in which no image is to be displayed, and
the slit for ease of separation is formed by cutting a portion of sheet material, and the portion is positioned on the black matrix.

18. The method of claim 2, wherein
the joined body is a display panel composed of a first substrate and a second substrate joined together by resin material,
the first substrate is formed on the first base material, and the second substrate is formed on the second base material,
the predetermined area of the first base material is on a surface of the first substrate facing the second substrate,
the sheet material is attached to the first base material such that the resin material faces the first substrate, and
the method further comprises:
uniting, after separating the part of the resin material, the first base material and the second base material such that the first substrate and the second substrate correspond to each other,; and
curing, after uniting the first base material and the second base material, the resin material remaining on the predetermined area of the first base material united with the second base material.

19. The method of claim 18, wherein
the first substrate formed on the first base material is provided in a plurality, and
the second substrate formed on the second base material is provided in a plurality, and the second substrates correspond to the first substrates.

20. The method of claim 18, wherein
the first base material has a mark defining a display area of the display panel.

21. The method of claim 20, wherein
the slit for ease of separation is formed by intermittently cutting the sheet material in accordance with a position of the mark.

22. The method of claim 20, wherein
the slit for ease of separation is formed by continuously cutting the sheet material in accordance with a position of the mark, and
in order to separate the part of the resin material,
a peeling member is attached to a part of the sheet base material remaining on the first base material, and
the peeling member is peeled from the first substrate.

23. The method of claim 18, wherein
the first substrate is a substrate on which a color filter is formed, and
the second substrate is a substrate on which an organic EL element is formed.

24. The method of claim 23, wherein
the first substrate has a black matrix formed like a belt along an outer circumference of the predetermined area,
the color filter is more internally disposed than the black matrix, and
an outer circumference of the black matrix coincides with the outer circumference of the predetermined area.

25. The method of claim 24, wherein
in forming the slit for ease of separation,
the sheet material is cut on the black matrix.

26. The method of claim 24, wherein
after curing the resin material remaining on the predetermined area,
the first base material and the second base material in a joined state are cut out along a track remaining on the black matrix on which the sheet material has been cut.

27. The method of claim 24, wherein
after curing the resin material remaining on the predetermined area,
the first base material and the second base material in a joined state are cut out at a portion of the black matrix inside the track.

28. The method of claim 18 further comprising:
forming a release film outside the predetermined area on the first base material before attaching the sheet material to the first base material.

* * * * *